(12) United States Patent
Lee et al.

(10) Patent No.: US 11,894,102 B2
(45) Date of Patent: Feb. 6, 2024

(54) DUTY CORRECTION DEVICE INCLUDING DUTY CORRECTION CIRCUIT AND SEMICONDUCTOR DEVICE INCLUDING DUTY CORRECTION DEVICE

(71) Applicant: SK hynix Inc., Gyeonggi-do (KR)

(72) Inventors: Chang Kwon Lee, Gyeonggi-do (KR); Su Hyun Oh, Gyeonggi-do (KR); Jin Hyung Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 149 days.

(21) Appl. No.: 17/690,932

(22) Filed: Mar. 9, 2022

(65) Prior Publication Data

US 2023/0113204 A1 Apr. 13, 2023

(30) Foreign Application Priority Data

Sep. 27, 2021 (KR) .......................... 10-2021-0126911

(51) Int. Cl.
G11C 7/22 (2006.01)
H01L 25/065 (2023.01)
H03K 3/017 (2006.01)
H01L 25/18 (2023.01)

(52) U.S. Cl.
CPC .......... G11C 7/222 (2013.01); H01L 25/0657 (2013.01); H01L 25/18 (2013.01); H03K 3/017 (2013.01); *H01L 2225/06541* (2013.01)

(58) Field of Classification Search
CPC ..... G11C 7/222; G11C 7/1093; G11C 7/1039; G11C 7/1066; G11C 2207/2254; H01L 25/0657; H01L 25/18; H01L 2225/06541; H01L 24/16; H01L 25/0652; H01L 2225/06513; H01L 2225/06517; H03K 3/017; H03K 5/1565
See application file for complete search history.

(56) References Cited

U.S. PATENT DOCUMENTS

| | | | | |
|---|---|---|---|---|
| 5,757,218 A | * | 5/1998 | Blum | ....................... H03K 5/06 327/175 |
| 10,573,361 B2 | * | 2/2020 | Choi | .................... G11C 7/1039 |
| 11,121,706 B1 | * | 9/2021 | Kim | ..................... G11C 11/4076 |

(Continued)

FOREIGN PATENT DOCUMENTS

KR 10-0971428 B1 7/2010

*Primary Examiner* — Khamdan N. Alrobaie
(74) *Attorney, Agent, or Firm* — IP & T GROUP LLP

(57) ABSTRACT

A duty correction device includes a clock generation circuit, first and second correction pulse generation circuits, and a duty correction circuit. The clock generation circuit generates first to third divided clock signals, each having a phase offset from a reference clock signal. The first correction pulse generation circuit generates a first correction pulse by detecting a phase difference between a delayed clock signal and the first and second divided clock signals. The second correction pulse generation circuit generates a second correction pulse by detecting a phase difference between the second and third divided clock signals. The duty correction circuit checks whether the first and second correction pulses are generated at a preset logic level of the reference clock signal, and reflects the first or second correction pulses in a duty correction operation for the reference clock signal according to a result of the check.

23 Claims, 14 Drawing Sheets

(56) References Cited

U.S. PATENT DOCUMENTS

| | | | | |
|---|---|---|---|---|
| 2008/0136479 A1* | 6/2008 | You | ............... | H03K 5/1565 |
| | | | | 327/161 |
| 2009/0045862 A1* | 2/2009 | Kim | ............... | H03K 5/151 |
| | | | | 327/256 |
| 2011/0234278 A1* | 9/2011 | Seo | ............... | H03L 7/0816 |
| | | | | 327/158 |
| 2016/0156342 A1* | 6/2016 | Yun | ............... | H03L 7/085 |
| | | | | 327/158 |
| 2016/0240234 A1* | 8/2016 | Shim | ............... | G11C 7/225 |
| 2017/0111034 A1* | 4/2017 | Kim | ............... | H03K 5/15 |
| 2020/0059226 A1* | 2/2020 | Choi | ............... | H03K 5/1565 |
| 2020/0111523 A1* | 4/2020 | Lee | ............... | G11C 11/4076 |
| 2022/0109434 A1* | 4/2022 | Han | ............... | G06F 1/10 |

\* cited by examiner

DUTY CORRECTION DEVICE INCLUDING DUTY CORRECTION CIRCUIT AND SEMICONDUCTOR DEVICE INCLUDING DUTY CORRECTION DEVICE

CROSS-REFERENCE TO RELATED APPLICATION

This application claims priority under 35 U.S.C. § 119 to Korean Patent Application No. 10-2021-0126911, filed on Sep. 27, 2021, the contents of which are incorporated herein by reference in its entirety.

BACKGROUND

1. Field

Various embodiments relate to a duty correction device, and a semiconductor device which includes a duty correction device.

2. Discussion of the Related Art

Data transmission speeds of integrated circuits and other types of semiconductor devices are continually increasing. This produces certain challenges to system designers. For example, the use of high-frequency clock signals for transmitting data between integrated circuits may adversely affect performance at higher transmission speeds. In an attempt to compensate for these effects, some integrated circuit chips use multi-phase clock signals having a frequency lower than clock signals used for data transmission between the integrated circuits. However, this approach has proven to have drawbacks.

SUMMARY

Various embodiments are directed to providing a duty correction device including a duty correction circuit capable of performing a duty correction operation according to a result of detecting a phase difference between multi-phase clock signals, and a semiconductor device including the duty correction device.

Technical problems to be achieved in the present disclosure are not limited to the aforementioned technical problems and the other unmentioned technical problems will be clearly understood by those skilled in the art from the following description.

In accordance with an embodiment of the present invention, a duty correction device may include: a clock generation circuit configured to generate first to third divided clock signals, each having a phase offset from a reference clock signal; a first correction pulse generation circuit configured to generate a first correction pulse by detecting a phase difference between a delayed clock signal and the first and second divided clock signals, the delayed clock signal generated by delaying the reference clock signal; a second correction pulse generation circuit configured to generate a second correction pulse by detecting a phase difference between the second and third divided clock signals; and a duty correction circuit configured to check whether the first and second correction pulses are generated at a preset logic level of the reference clock signal, and to reflect at least one of the first or second correction pulses in a duty correction operation for the reference clock signal according to a result of the check.

In accordance with an embodiment of the present invention, a semiconductor device may include: a data pad and a data strobe pad; a clock generation circuit configured to generate first to fourth write clock signals by dividing a write clock signal at a set ratio, the write clock signal received through the data strobe pad; a first alignment circuit configured to align write data in response to the first to fourth write clock signals, the write data input through the data pad, and to transmit the first to fourth write clock signals and the write data through a first clock transmission path and a first data transmission path; and first to fourth duty correction devices, each configured to receive the first to fourth write clock signals transferred through the first clock transmission path, to receive one of the first to fourth write clock signals as a reference clock signal and remaining ones of the first to fourth write clock signals as first to third divided clock signals alternatively according to phases of the first to fourth write clock signals, to detect a phase difference between the reference clock signal and the first to third divided clock signals, and to perform a duty correction operation on the reference clock signal.

In accordance with an embodiment of the present invention, a semiconductor device may include: a command pad, a clock pad, and a data strobe pad; a clock generation circuit configured to generate first to fourth read clock signals by dividing an external clock signal at a set ratio in response to a read command received through the command pad, the external clock signal input through the clock pad, and to transmit the first to fourth read clock signals to a first clock transmission path and the data strobe pad; a first alignment circuit configured to align read data in response to the first to fourth read clock signals received through the first clock transmission path, the read data output from a memory cell area, and to transmit the first to fourth read clock signals and the read data through a second clock transmission path and a first data transmission path; and first to fourth duty correction devices, each configured to receive the first to fourth read clock signals transferred through the first and second clock transmission paths, to receive one of the first to fourth read clock signals as a reference clock signal and remaining ones of the first to fourth read clock signals as first to third divided clock signals alternatively according to phases of the first to fourth read clock signals, to detect a phase difference between the reference clock signal and the first to third divided clock signals, and to perform a duty correction operation on the reference clock signal.

In accordance with an embodiment of the present invention, a duty correction device may include: a clock generation circuit configured to receive an input clock signal and generate a reference clock signal and first to third divided clock signals, the first divided clock signal having a phase offset from the reference clock signal, the second divided clock signal having the phase offset from the first clock signal, the third divided clock signal having the phase offset from the second clock signal; a delay circuit configured to delay the reference clock signal and generate a delayed clock signal; a first correction pulse generation circuit configured to combine the delayed clock signal and the first divided clock signal to generate a correction clock signal, and generate a first correction pulse based on the correction clock signal and the second divided clock signal; a second correction pulse generation circuit configured to generate a second correction pulse based on the second and third divided clock signals; and a duty correction circuit configured to: receive the reference clock signal and the first and second correction pulses, check whether the first and second correction pulses are generated at a preset logic level of the reference clock signal, and use at least one of the first or second correction pulses to correct a duty of the reference clock signal based on a result of the check.

The present technology may perform a duty correction operation on a reference clock signal according to a result of detecting a phase difference between multi-phase clock signals including a reference clock signal and first to third divided clock signals.

Particularly, the present technology may detect a phase difference between the reference clock signal and the first and second divided clock signals to generate a first correction pulse for extending a preset logic level of the reference clock signal, detect a phase difference between the second and third divided clock signals to generate a second correction pulse for reducing the preset logic level of the reference clock signal, and reflect at least one of the first and second correction pulses in a duty correction operation for the reference clock signal according to the preset logic level of the reference clock signal and the generation time points of the first and second correction pulses.

Consequently, it is possible to minimize the occurrence of a duty ratio error in the process of transmitting multi-phase clock signals.

DETAILED DESCRIPTION

Figure 1:
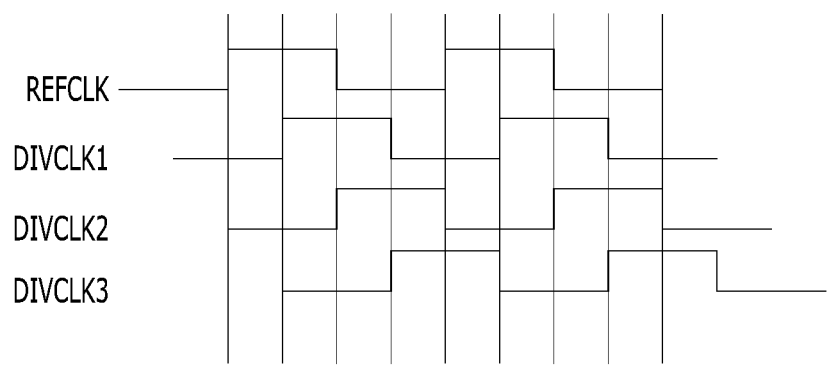
FIG. 1 illustrates an example of multi-phase clock signals.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware-for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram illustrating an example of multi-phase clock signals which include clock signals REFCLK and DIVCLK1 to DIVCLK3 having a phase difference of 90° therebetween.

Referring to FIG. 1, the rising edge of the reference clock signal REFCLK and the rising edge of a first divided clock signal DIVCLK1 may have a phase difference of 90° therebetween, and the rising edge of the first divided clock signal DIVCLK1 and the rising edge of a second divided clock signal DIVCLK2 may have a phase difference of 90° therebetween. Furthermore, the rising edge of the second divided clock signal DIVCLK2 and the rising edge of a third divided clock signal DIVCLK3 may have a phase difference of 90° therebetween, and the rising edge of the third divided clock signal DIVCLK3 and the rising edge of the reference clock signal REFCLK may have a phase difference of therebetween. Furthermore, the four clock signals REFCLK and DIVCLK1 to DIVCLK3 may each have a duty ratio of 50%, e.g., the four clock signals REFCLK and DIVCLK1 to DIVCLK3 may have substantially the same logic high level period and substantially the same logic low level period.

FIG. 1 illustrates that the multi-phase clock signals REFCLK and DIVCLK1 to DIVCLK3 have the most ideal phase difference and duty ratio. However, when the multi-phase clock signals REFCLK and DIVCLK1 to DIVCLK3 are actually used in an integrated circuit, the problem may often occur that the phase difference among the clock signals REFCLK and DIVCLK1 to DIVCLK3 is not substantially maintained at 90° and the duty ratio of each of the clock signals REFCLK and DIVCLK1 to DIVCLK3 is not substantially maintained at 50%.

Figure 2:
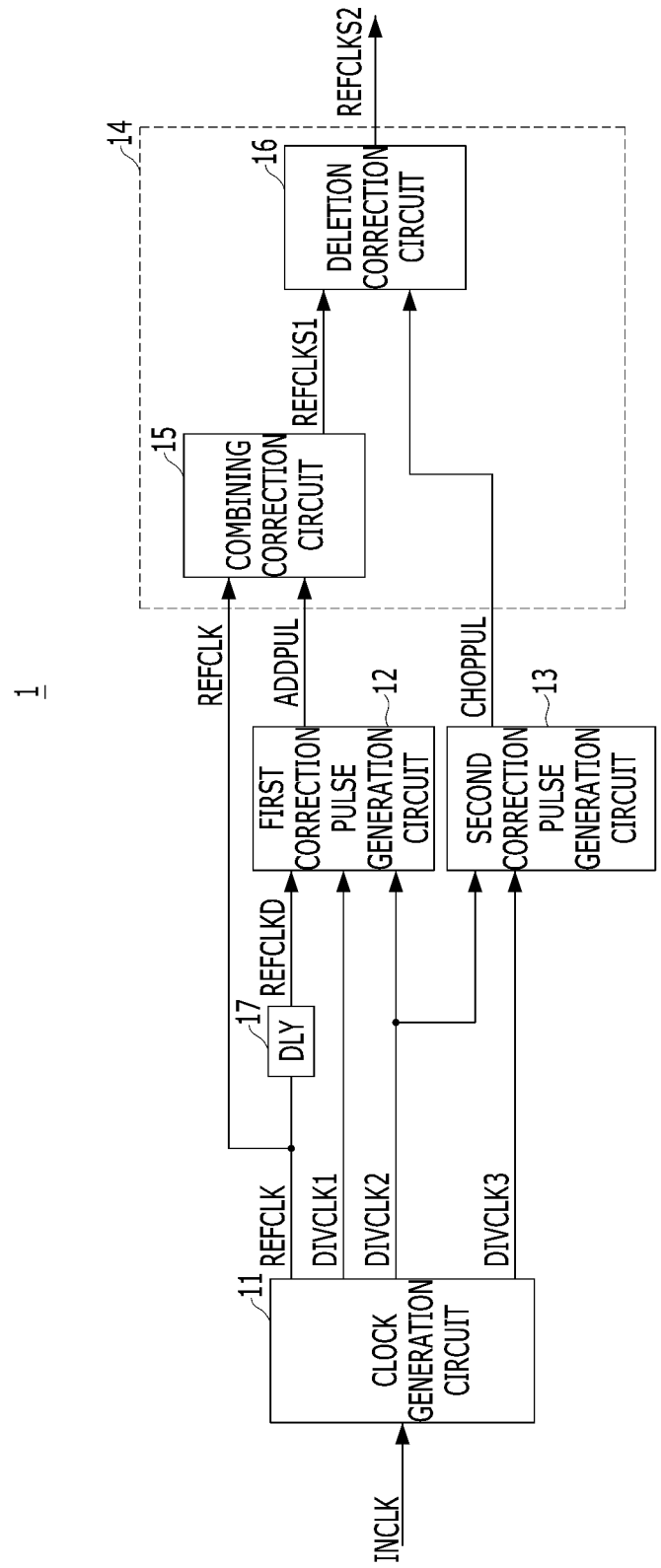
FIG. 2 illustrates an embodiment of a duty correction device.

FIG. 2 is a diagram illustrating an embodiment of a duty correction device 1 which may include a clock generation circuit 11, a first correction pulse generation circuit 12, a second correction pulse generation circuit 13, a duty correction circuit 14, and a clock delay circuit (DLY) 17. Furthermore, the duty correction circuit 14 may include a combining correction circuit 15 and a deletion correction circuit 16.

The clock generation circuit 11 may include a multi-phase clock generation circuit which may receive an input clock signal INCLK and generate a plurality of clock signals. The multi-phase clock generation circuit may generate the plurality of clock signals by dividing or not dividing a frequency of the input clock signal INCLK. The clock signals generated by the multi-phase clock generation circuit may have different phases, and in one embodiment may have phases synchronized with an edge of the input clock signal INCLK. For example, the clock generation circuit 11 may generate a reference clock signal REFCLK and first to third divided clock signals DIVCLK1 to DIVCLK3 by dividing the input clock signal INCLK. In one embodiment, each of the reference clock signal REFCLK and the first to third divided clock signals DIVCLK1 to DIVCLK3 may have a phase close to (e.g., to within a predetermined amount, offset from, or otherwise based on) the reference clock signal REFCLK.

The clock generation circuit 11 may generate the reference clock signal REFCLK and the first to third divided clock signals DIVCLK1 to DIVCLK3 sequentially having a phase difference of 90° from the reference clock signal REFCLK. This may be accomplished by dividing the input clock signal INCLK based on a ratio of ¼, e.g., the reference clock signal REFCLK may have a phase ahead of the first divided clock signal DIVCLK1 by a particular phase (e.g., 90°) and the first divided clock signal DIVCLK1 may have a phase ahead of the second divided clock signal DIVCLK2 by 90°. Furthermore, the second divided clock signal DIVCLK2 may have a phase ahead of the third divided clock signal DIVCLK3 by 90°, and the third divided clock signal DIVCLK3 may have a phase ahead of the reference clock signal REFCLK by 90°.

The delay (DLY) 17 may generate a delayed clock signal REFCLKD by delaying the reference clock signal REFCLK. The DLY 17 may generate the delayed clock signal REFCLKD by delaying the reference clock signal REFCLK by a set delay amount. The set delay amount may be a delay amount which, for example, causes a rising edge of the delayed clock signal REFCLKD to have a phase behind that of a rising edge of the reference clock signal REFCLK by 90°. The first correction pulse generation circuit 12 may generate a first correction pulse ADDPUL by detecting a phase difference between the delayed clock signal REFCLKD and the first and second divided clock signals DIVCLK1 and DIVCLK2. The first correction pulse ADDPUL may extend a preset logic level pulse width of the reference clock signal REFCLK.

The second correction pulse generation circuit 13 may generate a second correction pulse CHOPPUL by detecting a phase difference between the second divided clock signal DIVCLK2 and the third divided clock signal DIVCLK3. The second correction pulse CHOPPUL may reduce the preset logic level pulse width of the reference clock signal REFCLK.

The duty correction circuit 14 may check the logic level of the reference clock signal REFCLK, the generation time point of the first correction pulse ADDPUL, and the generation time point of the second correction pulse CHOPPUL, and may reflect at least one of the first correction pulse ADDPUL or the second correction pulse CHOPPUL in a duty correction operation for the reference clock signal REFCLK according to the check result. In one embodiment, in performing the duty correction operation for the reference clock signal REFCLK, the duty correction circuit 14 may reflect only the first correction pulse ADDPUL or the second correction pulse CHOPPUL generated when the reference clock signal REFCLK is at the preset logic level.

The combining correction circuit 15 may selectively perform a first combining operation for combining the first correction pulse ADDPUL with the reference clock signal REFCLK. This operation may be performed, for example, according to whether the first correction pulse ADDPUL is generated while the reference clock signal REFCLK is at the preset logic level.

When the first correction pulse ADDPUL is generated while the reference clock signal REFCLK is at the preset logic level, the combining correction circuit 15 may generate a clock signal REFCLKS1 by performing the first combining operation for combining the first correction pulse ADDPUL with the reference clock signal REFCLK. For reference, the preset logic level may mean a logic high level or a logic low level. In one embodiment, the preset logic level may be defined as a logic high level.

When the first correction pulse ADDPUL is generated while the reference clock signal REFCLK is at a logic high level, the combining correction circuit 15 may generate the clock signal REFCLKS1 by performing the first combining operation for combining the first correction pulse ADDPUL with the reference clock signal REFCLK. When the first correction pulse ADDPUL is generated while the reference clock signal REFCLK is at a logic low level, the combining correction circuit 15 may output the reference clock signal REFCLK as REFCLKS1 without performing the first combining operation for combining the first correction pulse ADDPUL with the reference clock signal REFCLK.

The deletion correction circuit 16 may selectively perform a first deletion operation for deleting the second correction pulse CHOPPUL from the clock signal REFCLKS1 output from the combining correction circuit 15. This operation may be performed, for example, according to whether the second correction pulse CHOPPUL is generated while the clock signal REFCLKS1 output from the combining correction circuit 15 is at a preset logic level.

When the second correction pulse CHOPPUL is generated while the clock signal REFCLKS1 output from the combining correction circuit is at a preset logic level, the deletion correction circuit 16 may generate a clock signal REFCLKS2. This operation may be accomplished by performing the first deletion operation for deleting the second correction pulse CHOPPUL from the clock signal REFCLKS1 output from the combining correction circuit 15.

When the second correction pulse CHOPPUL is generated while the clock signal REFCLKS1 output from the combining correction circuit is at a logic high level, the deletion correction circuit 16 may generate the clock signal REFCLKS2 by performing the first deletion operation for deleting the second correction pulse CHOPPUL from the clock signal REFCLKS1 output from the combining correction circuit 15. When the second correction pulse CHOPPUL is generated while the clock signal REFCLKS1 output from the combining correction circuit 15 is at a logic low level, the deletion correction circuit 16 may output the clock signal REFCLKS1 as REFCLKS2 without performing the first deletion operation for deleting the second correction pulse CHOPPUL from the clock signal REFCLKS1 output from the combining correction circuit 15.

Figure 3A:
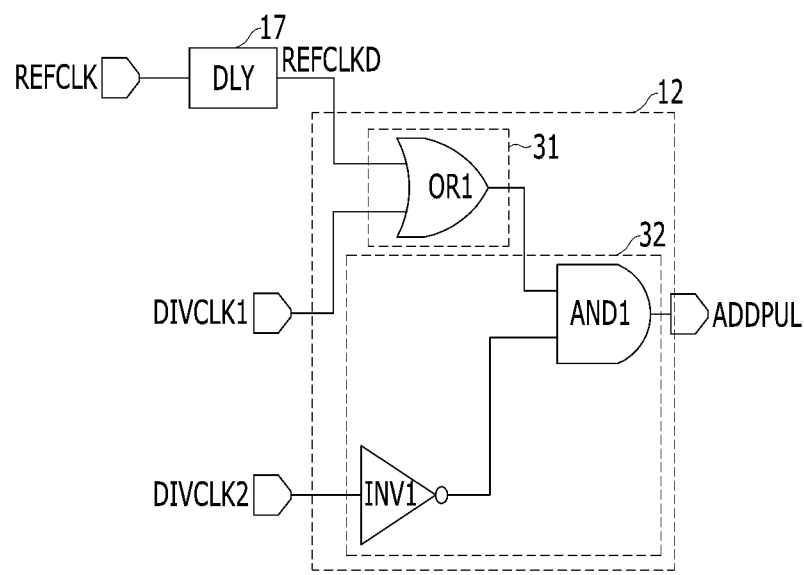
FIGS. 3A and 3B illustrate embodiments of first and second correction pulse generation circuits.
Figure 3B:
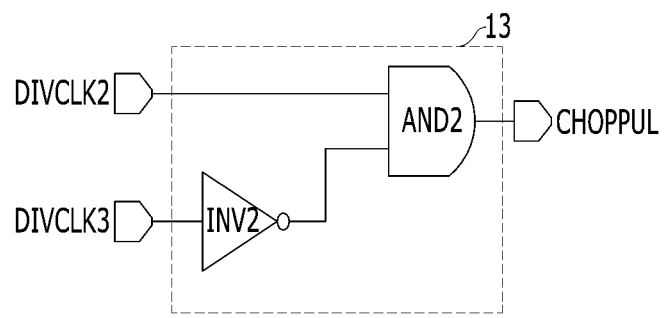

FIGS. 3A and 3B are diagrams illustrating embodiments of the first and second correction pulse generation circuits among the components of the duty correction device shown in FIG. 2.

Referring to FIG. 3A, the first correction pulse generation circuit 12 may generate the first correction pulse ADDPUL by detecting the phase difference between the delayed clock signal REFCLKD (generated by the DLY 17 that delays the reference clock signal REFCLK) and the first and second divided clock signals DIVCLK1 and DIVCLK2.

In one embodiment, the first correction pulse generation circuit 12 may include a clock combining circuit 31 and a first correction pulse output circuit 32

The clock combining circuit 31 may perform a second combining operation for combining the delayed clock signal REFCLKD with the first divided clock signal DIVCLK1.

The clock combining circuit 31 may include an OR gate OR1 that receives the delayed clock signal REFCLKD and the first divided clock signal DIVCLK1 and performs an OR operation on the received signals.

The first correction pulse output circuit 32 may activate the first correction pulse ADDPUL to a logic high level on the basis of a rising edge of a clock signal output from the clock combining circuit 31. Furthermore, the first correction pulse output circuit 32 may output the first correction pulse ADDPUL activated to a logic high level when both the clock signal output from the clock combining circuit 31 and an inverted second divided clock signal DIVCLK2 are at logic high levels.

In one embodiment, the first correction pulse output circuit 32 may include an inverter INV1 for inverting the second divided clock signal DIVCLK2, and an AND gate AND1 that performs an AND operation on the clock signal output from the clock combining circuit 31 and the second divided clock signal DIVCLK2 inverted through the inverter INV1.

Referring to FIG. 3B, the second correction pulse generation circuit 13 may activate the second correction pulse CHOPPUL to a logic high level on the basis of a rising edge of the second divided clock signal DIVCLK2. Furthermore, the second correction pulse generation circuit 13 may output the second correction pulse CHOPPUL activated to a logic high level when both the second divided clock signal DIVCLK2 and an inverted third divided clock signal DIVCLK3 are at logic high levels.

In one embodiment, the second correction pulse generation circuit 13 may include an inverter INV2 for inverting the third divided clock signal DIVCLK3, and an AND gate AND2 that performs an AND operation on the second divided clock signal DIVCLK2 and the third divided clock signal DIVCLK3 inverted through the inverter INV2.

Figure 4A:
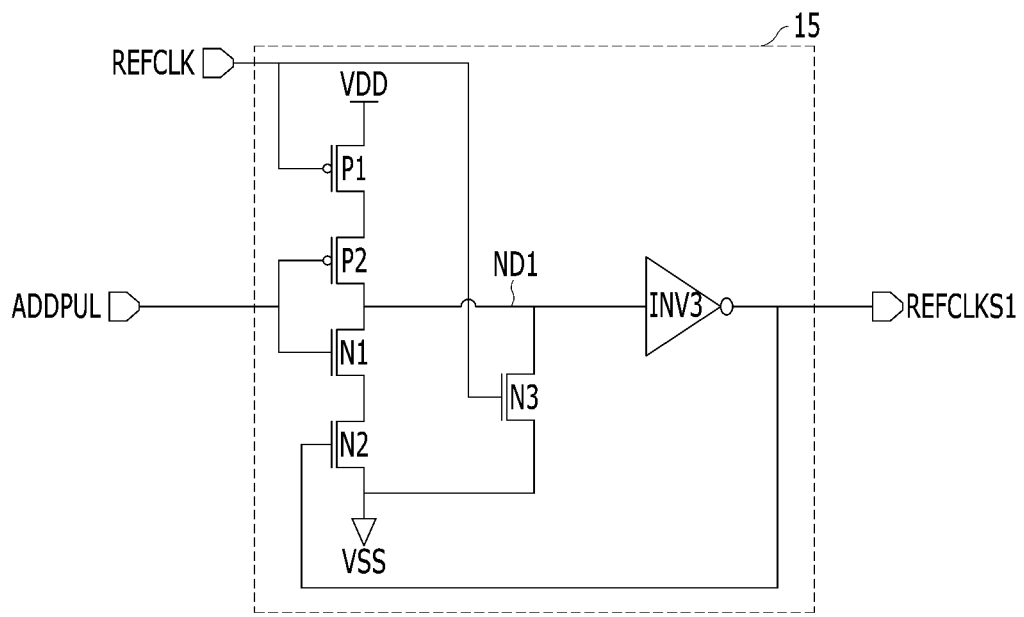
FIGS. 4A and 4B illustrate an embodiment of a duty correction circuit.
Figure 4B:
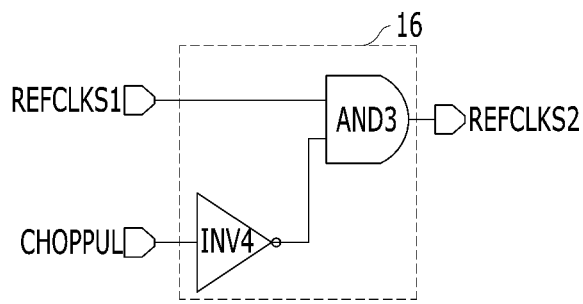

FIGS. 4A and 4B are diagrams illustrating an embodiment of the duty correction circuit among the components of the duty correction device shown in FIG. 2.

Referring to FIG. 4A, the duty correction circuit 14 may include a combining correction circuit 15 and a deletion correction circuit 16.

When the first correction pulse ADDPUL is generated while the reference clock signal REFCLK is at the preset logic level, the combining correction circuit 15 may extend the preset logic level pulse width of the reference clock signal REFCLK by performing the first combining operation for combining the first correction pulse ADDPUL with the reference clock signal REFCLK.

When the rising edge of the first correction pulse ADDPUL is generated while the reference clock signal REFCLK is at a logic high level, the combining correction circuit 15 may extend a logic high level pulse width of the reference clock signal REFCLK by performing the first combining operation for combining a logic high level pulse of the first correction pulse ADDPUL with a logic high level pulse of the reference clock signal REFCLK.

When the first correction pulse ADDPUL is generated while the reference clock signal REFCLK is at a logic low level, the combining correction circuit 15 may not extend the logic high level pulse width of the reference clock signal REFCLK because the combining correction circuit 15 does not perform the first combining operation for combining the first correction pulse ADDPUL with the reference clock signal REFCLK.

When the rising edge of the first correction pulse ADDPUL is generated while the reference clock signal REFCLK is at a logic low level, the combining correction circuit 15 may not combine a logic high level active period of the first correction pulse ADDPUL with a logic high level period of the reference clock signal REFCLK.

When the second correction pulse CHOPPUL is generated while the clock signal REFCLKS1 output from the combining correction circuit is at a preset logic low level, the deletion correction circuit 16 may reduce a preset logic level pulse width of the clock signal REFCLKS1 output from the combining correction circuit 15. In so doing, the deletion correction circuit 16 may perform the first deletion operation for deleting the second correction pulse CHOPPUL from the clock signal REFCLKS1 output from the combining correction circuit 15.

When the rising edge of the second correction pulse CHOPPUL is generated while the clock signal REFCLKS1 output from the combining correction circuit 15 is at a logic high level, the deletion correction circuit 16 may reduce a logic high level pulse width of the clock signal REFCLKS1 output from the combining correction circuit 15. This may be accomplished by performing the first deletion operation for deleting a pulse of the second correction pulse CHOPPUL activated to a logic high level from the logic high level pulse of the clock signal REFCLKS1 output from the combining correction circuit 15.

When the second correction pulse CHOPPUL is generated while the clock signal REFCLKS1 output from the combining correction circuit is at a logic low level, the deletion correction circuit 16 may not reduce the logic high level pulse width of the clock signal REFCLKS1 output from the combining correction circuit 15. This is because the deletion correction circuit 16 does not perform the first deletion operation for deleting the second correction pulse CHOPPUL from the clock signal REFCLKS1 output from the combining correction circuit 15.

When the rising edge of the second correction pulse CHOPPUL is generated while the clock signal REFCLKS1 output from the combining correction circuit 15 is at a logic low level, the deletion correction circuit 16 may not perform the first deletion operation. This is because the logic high level pulse of the clock signal REFCLKS1 output from the combining correction circuit 15 may not overlap the logic high level pulse of the second correction pulse CHOPPUL.

For reference, when the first combining operation is not performed by the combining correction circuit 15, the clock signal REFCLKS1 output from the combining correction circuit 15 may be substantially the same clock signal as the reference clock signal REFCLK. Of course, when the first combining operation is performed by the combining correction circuit 15, the clock signal REFCLKS1 output from the combining correction circuit 15 may be a clock signal having an extended logic level pulse width as compared to the reference clock signal REFCLK.

In one embodiment, the combining correction circuit 15 may include two PMOS transistors P1 and P2, three NMOS transistors N1 to N3, and an inverter INV3.

The first PMOS transistor P1 may selectively connect a source-drain connected power supply voltage VDD terminal and a source terminal of the second PMOS transistor P2 in response to the reference clock signal REFCLK input to the gate thereof.

The second PMOS transistor P2 may selectively connect a drain terminal of the source-drain connected first PMOS transistor P1 and a first node ND1 in response to the first correction pulse ADDPUL input to the gate thereof.

The first NMOS transistor N1 may selectively connect the drain-source connected first node ND1 and a drain terminal of the second NMOS transistor N2 in response to the first correction pulse ADDPUL input to the gate thereof.

The second NMOS transistor N2 may selectively connect a source terminal of the drain-source connected first NMOS transistor N1 and a source voltage VSS terminal in response to an output clock signal REFCLKS1 input to the gate thereof.

The third NMOS transistor N3 may selectively connect the drain-source connected first node ND1 and the source voltage VSS terminal in response to the reference clock signal REFCLK input to the gate thereof.

The inverter INV3 may invert a signal on the first node ND1 and output the inverted signal as the output clock signal REFCLKS1.

Referring to FIG. 4B, in one embodiment, the deletion correction circuit 16 may include an inverter INV4 for inverting the second correction pulse CHOPPUL, and an AND gate AND3 that performs an AND operation on the second correction pulse CHOPPUL inverted through the inverter INV4 and the output clock signal REFCLKS1 of the combining correction circuit 15.

FIGS. 5A-5C, 6A-6C, 7A, 7B, 8A-8C, and 9A-9C are diagrams for explaining embodiments of the operation of the duty correction device in accordance with FIGS. 2 to 4B.

Figure 5A:
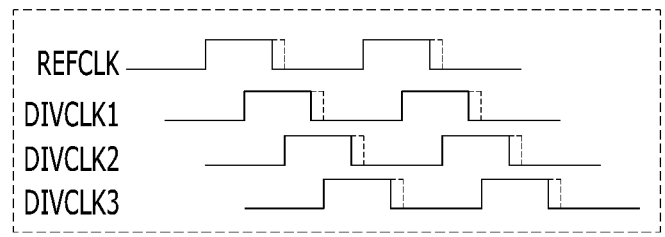
FIGS. 5A-5C, 6A-6C, 7A, 7B, 8A-8C, and 9A-9C are diagrams explaining operation of the duty correction device in accordance with one or more embodiments.

Referring to FIG. 5A, it can be understood that for multi-phase clock signals, the logic high level pulse width (solid line) of each of the reference clock signal REFCLK and the first to third divided clock signals DIVCLK1 to DIVCLK3 is narrower than the logic high level pulse width (dotted line) corresponding to the duty ratio of 50%. The reference clock signal REFCLK and the first to third divided clock signals DIVCLK1 to DIVCLK3 may sequentially have a phase difference of 90° therebetween. In another embodiment, the phase difference may be a predetermined angle different from 90°.

During operation, a problem may arise where the duty ratio of the multi-phase clock signal does not substantially maintain 50%. This may occur, for example, immediately when the multi-phase clock signal is generated by the clock generation circuit 11, but may also occur due to various types of noise in the process of transmitting the clock generation circuit 11 in an integrated circuit.

Figure 5B:
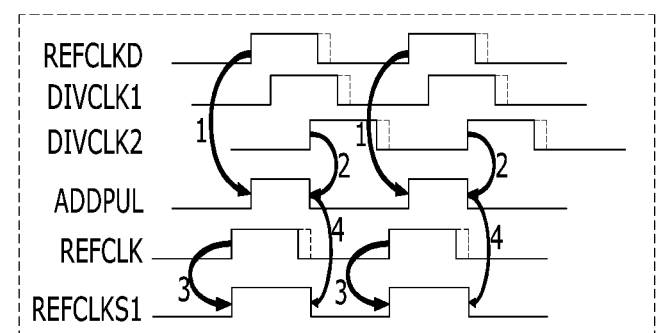

Referring to FIG. 5B, the DLY 17 may generate the delayed clock signal REFCLKD by delaying the reference clock signal REFCLK. At this time, the delayed clock signal REFCLKD may have a phase ahead of the first divided clock signal DIVCLK1. For example, the rising edge of the delayed clock signal REFCLKD may be located between the rising edge of the reference clock signal REFCLK and the rising edge of the first divided clock signal DIVCLK1.

The clock combining circuit 31 may include the OR gate OR1 that performs an OR operation on the delayed clock signal REFCLKD and the first divided clock signal DIVCLK1. The clock combining circuit 31 may generate an output signal having a pulse activated to a logic high level during the period from the rising edge of the reference clock signal REFCLK and the falling edge of the first divided clock signal DIVCLK1.

The first correction pulse output circuit 32 may activate the first correction pulse ADDPUL to a logic high level on the basis of the rising edge of the clock signal output from the clock combining circuit 31. Furthermore, the first correction pulse output circuit 32 may output the first correction pulse ADDPUL activated to a logic high level when both the clock signal output from the clock combining circuit 31 and the inverted second divided clock signal DIVCLK2 are at logic high levels. The first correction pulse output circuit 32 may output the first correction pulse ADDPUL enabled to a logic high level during the period from the rising edge (1) of the delayed clock signal REFCLKD to the rising edge (2) of the second divided clock signal DIVCLK2.

The combining correction circuit 15 may generate the output clock signal REFCLKS1 activated to a logic high level by combining the logic high level period of the reference clock signal REFCLK with the logic high level period of the first correction pulse ADDPUL. Since the falling edge (4) of the first correction pulse ADDPUL corresponds to the rising edge of the second divided clock signal DIVCLK2, the output clock signal REFCLKS1 may be activated to a logic high level during the period in which the logic high level pulse of the reference clock signal REFCLK is extended to the rising edge of the second divided clock signal DIVCLK2.

Figure 5C:
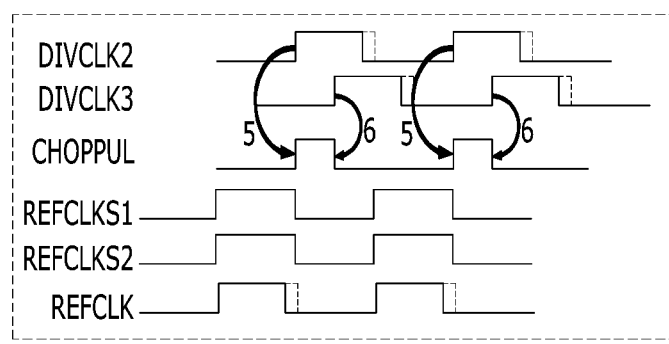

Referring to FIG. 5C, the second correction pulse generation circuit 13 may activate the second correction pulse CHOPPUL to a logic high level on the basis of the rising edge (5) of the second divided clock signal DIVCLK2.

Furthermore, the second correction pulse generation circuit 13 may output the second correction pulse CHOPPUL activated to a logic high level when both the second divided clock signal DIVCLK2 and the inverted third divided clock signal DIVCLK3 are at logic high levels. Accordingly, the second correction pulse generation circuit 13 may output the second correction pulse CHOPPUL activated to a logic high level during the period from the rising edge (5) of the second divided clock signal DIVCLK2 to the rising edge (6) of the third divided clock signal DIVCLK3.

As described with reference to FIG. 5B, the logic high level pulse of the clock signal REFCLKS1 output from the combining correction circuit 15 may be a pulse obtained by combining the logic high level pulse of the reference clock signal REFCLK with the logic high level pulse of the first correction pulse ADDPUL. At this time, since both the falling edge (4) of the first correction pulse ADDPUL and the rising edge (5) of the second correction pulse CHOPPUL correspond to the rising edge of the second divided clock signal DIVCLK2, the logic high level pulse of the first correction pulse ADDPUL and the logic high level pulse of the second correction pulse CHOPPUL may not overlap each other.

Accordingly, the logic high level pulse of the clock signal REFCLKS1 output from the combining correction circuit 15 and the logic high level pulse of the second correction pulse CHOPPUL may not overlap each other. Thus, it can be understood that the logic high level pulse of the second correction pulse CHOPPUL is generated while the clock signal REFCLKS1 output from the combining correction circuit 15 is at a logic low level.

Accordingly, the deletion correction circuit 16 may not delete the second correction pulse CHOPPUL from the clock signal REFCLKS1 output from the combining correction circuit 15. Accordingly, in one embodiment, the clock signal REFCLKS1 output from the combining correction circuit 15 and the clock signal REFCLKS2 output from the deletion correction circuit 16 may be substantially the same clock signal.

Figure 6A:
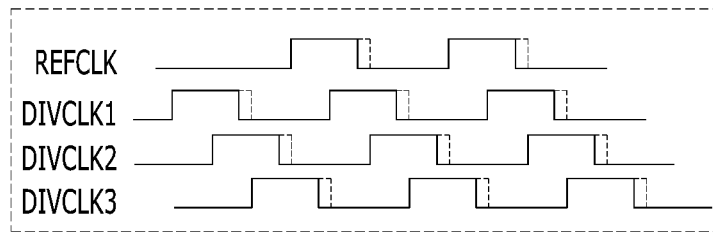
Figure 6B:
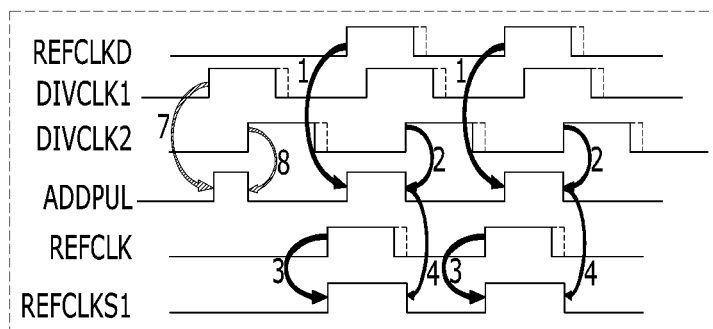
Figure 6C:
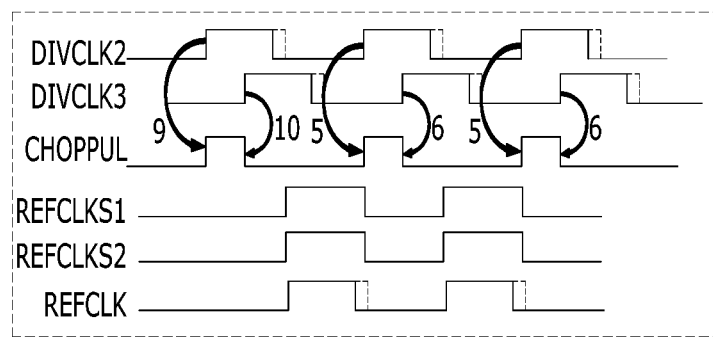

Referring to FIG. 6A, when the phase of the reference clock signal REFCLK is behind the phase of the first divided clock signal DIVCLK1, first correction pulse ADDPUL and second correction pulse CHOPPUL may be unnecessarily generated as indicated in FIGS. 6B and 6C.

Specifically, referring to FIG. 6B, the DLY 17 may generate the delayed clock signal REFCLKD by delaying the reference clock signal REFCLK.

The clock combining circuit 31 may include the OR gate OR1 that performs an OR operation on the delayed clock signal REFCLKD and the first divided clock signal DIVCLK1. The clock combining circuit 31 may generate an output signal having a pulse activated to a logic high level during the period from the rising edge of the delayed clock signal REFCLKD and the falling edge of the first divided clock signal DIVCLK1. At this time, since the phase of the first divided clock signal DIVCLK1 is ahead of the phase of the reference clock signal REFCLK, the first logic high level pulse of the first divided clock signal DIVCLK1 may not overlap the logic high level pulse of the delayed clock signal REFCLKD. Thus, the first preset logic high level pulse of the clock signal output from the clock combining circuit 31 may be the first logic high level pulse of the first divided clock signal DIVCLK1. Of course, the second and subsequent logic high level pulses of the clock signal output from the clock combining circuit 31 may generate an output signal having a pulse activated to a logic high level during the period from the rising edge of the delayed clock signal REFCLKD and the falling edge of the first divided clock signal DIVCLK1.

The first correction pulse output circuit 32 may activate the first correction pulse ADDPUL to a logic high level on the basis of the rising edge of the clock signal output from the clock combining circuit 31. Accordingly, the first correction pulse output circuit 32 may activate the first correction pulse ADDPUL to a logic high level at the rising edge (7) of the first divided clock signal DIVCLK1, which corresponds to the first rising edge of the clock signal output from the clock combining circuit 31, and may activate the first correction pulse ADDPUL to a logic high level at the rising edge (1) of the delayed clock signal REFCLKD, which corresponds to the second and subsequent rising edges of the clock signal output from the clock combining circuit 31.

Furthermore, the first correction pulse output circuit 32 may output the first correction pulse ADDPUL activated to a logic high level when both the clock signal output from the clock combining circuit 31 and the inverted second divided clock signal DIVCLK2 are at logic high levels. Accordingly, the first correction pulse output circuit 32 may output the first correction pulse ADDPUL activated to a logic high level from the rising edge (7) of the first divided clock signal DIVCLK1 (which corresponds to the first rising edge of the clock signal output from the clock combining circuit 31) to the rising edge (8) of the second divided clock signal DIVCLK2, and may output the first correction pulse ADDPUL activated to a logic high level from the rising edge (1) of the delayed clock signal REFCLKD (which corresponds to the second and subsequent rising edges of the clock signal output from the clock combining circuit 31) to the rising edge (2) of the second divided clock signal DIVCLK2.

As described above, since the delayed clock signal REFCLKD is a clock signal obtained by delaying the reference clock signal REFCLK and each of the first divided clock signal DIVCLK1 and the second divided clock signal DIVCLK2 has a phase ahead of the reference clock signal REFCLK, the first correction pulse ADDPUL (which is activated to a logic high level from the first rising edge (7) of the first divided clock signal DIVCLK1 to the rising edge (8) of the second divided clock signal DIVCLK2) may not be generated while the reference clock signal REFCLK is at a logic high level.

Accordingly, the combining correction circuit 15 may not activate the output clock signal REFCLKS1 to a logic high level with respect to the first logic high level pulse of the first correction pulse ADDPUL not generated while the reference clock signal REFCLK is at a logic high level.

Because there is a period in which the second and subsequent logic high level pulses of each of the first divided clock signal DIVCLK1 and the second divided clock signal DIVCLK2 overlap the first and subsequent logic high level pulses of the delayed clock signal REFCLKD, the first correction pulse ADDPUL may be generated while the reference clock signal REFCLK is at a logic high level, in substantially the same manner as described in FIGS. 5A to 5C.

The combining correction circuit 15 may generate the output clock signal REFCLKS1 (which is activated to a logic high level) with respect to the second and subsequent logic high level pulses of the first correction pulse ADDPUL generated while the reference clock signal REFCLK is at a logic high level. For example, the combining correction circuit 15 may generate the output clock signal REFCLKS1 by combining the logic high level period of the reference clock signal REFCLK with the logic high level period of the first correction pulse ADDPUL with respect to the second and subsequent logic high level pulses of the first correction pulse ADDPUL generated while the reference clock signal REFCLK is at a logic high level. Since the falling edge (4) of the first correction pulse ADDPUL corresponds to the rising edge of the second divided clock signal DIVCLK2, the output clock signal REFCLKS1 may be activated to a logic high level during the period in which the logic high level pulse of the reference clock signal REFCLK is extended to the rising edge of the second divided clock signal DIVCLK2.

Referring to FIG. 6C, as described with reference to FIG. 5C, the second correction pulse generation circuit 13 may output the second correction pulse CHOPPUL activated to a logic high level during the period from the rising edge (5) of the second divided clock signal DIVCLK2 to the rising edge (6) of the third divided clock signal DIVCLK3. However, in FIG. 6C, since the phases of the second divided clock signal DIVCLK2 and the third divided clock signal DIVCLK3 are ahead of the reference clock signal REFCLK as indicated in FIG. 6B, the first logic high level pulse of the second correction pulse CHOPPUL may be generated before the first logic high level pulse of the clock signal REFCLKS1 output from the combining correction circuit 15 is started. For example, as in the first correction pulse ADDPUL described with reference to FIG. 6B, the first logic high level pulse of the second correction pulse CHOPPUL may be generated while the clock signal REFCLKS1 output from the combining correction circuit 15 is at a logic low level. Accordingly, the deletion correction circuit 16 may not activate the second correction pulse CHOPPUL to a logic high level with respect to the first logic high level pulse of the second correction pulse CHOPPUL.

As described with reference to FIG. 5C, in FIG. 6C, the logic high level pulse of the first correction pulse ADDPUL and the logic high level pulse of the second correction pulse CHOPPUL may not overlap each other. Thus, the logic high level pulse of the clock signal REFCLKS1 output from the combining correction circuit 15 and the logic high level pulse of the second correction pulse CHOPPUL may not overlap each other. For example, in FIG. 6C, not only the first logic high level pulse but also the second and subsequent logic high level pulses of the second correction pulse CHOPPUL may be generated while the clock signal REFCLKS1 output from the combining correction circuit 15 is at a logic low level.

Accordingly, the deletion correction circuit 16 may not delete the second correction pulse CHOPPUL from the clock signal REFCLKS1 output from the combining correction circuit 15. Therefore, the clock signal REFCLKS1 output from the combining correction circuit 15 and the clock signal REFCLKS2 output from the deletion correction circuit 16 may be substantially the same clock signal.

For reference, FIGS. 6A-6C have been described based on the assumption that among the reference clock signal REFCLK and the first to third divided clock signals DIVCLK1 to DIVCLK3 included in the multi-phase clock signals, a clock signal having the most advanced phase is the first divided clock signal DIVCLK1. Even when the clock signal having the most advanced phase is the second divided clock signal DIVCLK2 or the third divided clock signal DIVCLK3, first correction pulse ADDPUL and second correction pulse CHOPPUL may be unnecessarily generated as described above. In accordance with one embodiment the duty correction circuit 14 may substantially prevent the first divided clock signal DIVCLK1 or the second divided clock signal DIVCLK2 from being unnecessarily generated according to the phase order of a clock signal from being reflected in a duty correction operation.

Figure 7A:
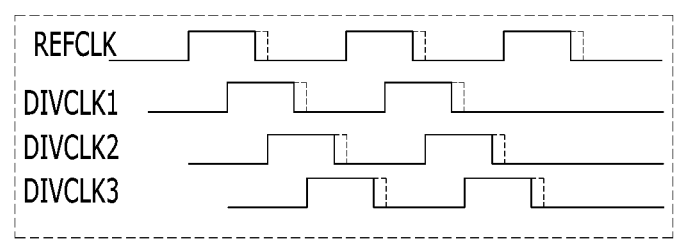
Figure 7B:
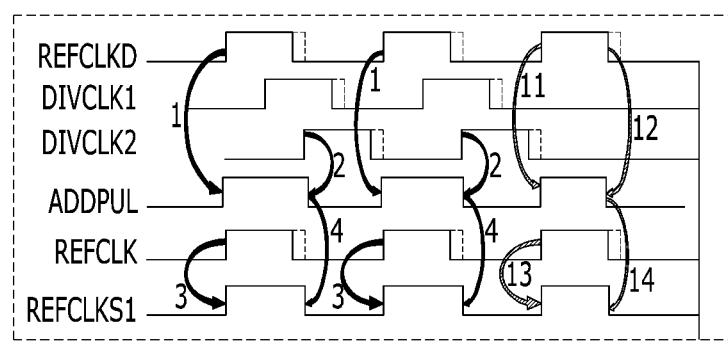

Referring to FIGS. 7A and 7B, it can be understood why the first correction pulse generation circuit 12 generates the first correction pulse ADDPUL by using the delayed clock signal REFCLKD obtained by delaying the reference clock signal REFCLK, instead of generating the first correction pulse ADDPUL by directly using the reference clock signal REFCLK.

Referring to FIG. 7A, it can be understood that this diagram illustrates a time point at which toggling is stopped after the multi-phase clock signals are generated in substantially the same form as in FIG. 6A.

Referring to FIG. 7B, it can be understood that the case is illustrated where the first correction pulse generation circuit 12 generates the first correction pulse ADDPUL by directly using the reference clock signal REFCLK.

In such a case, after the toggling of each of the first to third divided clock signals DIVCLK1 to DIVCLK3 is stopped, the last active period of the first correction pulse ADDPUL may be set in response to the last toggling of the reference clock signal REFCLK. For example, the first correction pulse ADDPUL may be activated to a logic high level at the rising edge (11) of the last logic high level pulse of the reference clock signal REFCLK, and may be deactivated to a logic low level at the falling edge (12) of the last logic high level pulse of the reference clock signal REFCLK.

Accordingly, the last logic high level pulse of the clock signal REFCLKS1 of the combining correction circuit 15 may have substantially the same pulse width as the last logic high level pulse of the reference clock signal REFCLK. Thus, the last logic high level pulse width of the reference clock signal REFCLK may not be extended by the logic high level pulse of the first correction pulse ADDPUL.

At this time, since the reference clock signal REFCLK has a state in which the logic high level pulse width (solid line) is narrower than the logic high level pulse width (dotted line) corresponding to the duty ratio of 50%, the operation illustrated in FIG. 7B is repeated. This may cause a problem where the last logic high level pulse width of the reference clock signal REFCLK is gradually narrowed and then disappears. For example, the first correction pulse ADDPUL may be generated by directly using the reference clock signal REFCLK as illustrated in FIG. 7B. This may cause a problem where the last logic high level pulse of the reference clock signal REFCLK disappears even though a duty correction operation is repeatedly performed on the reference clock signal REFCLK.

In order to substantially prevent such a problem from occurring, in one embodiment, the first correction pulse ADDPUL may be generated using the delayed clock signal REFCLKD obtained by delaying the reference clock signal REFCLK, as described above.

Figure 8A:
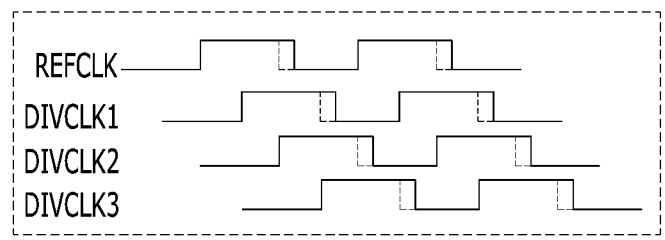
Figure 9A:
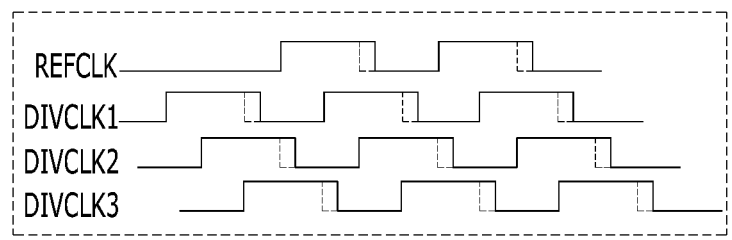

Referring to FIGS. 8A and 9A, it can be understood that for multi-phase clock signals, the logic high level pulse width (solid line) of each of the reference clock signal REFCLK and the first to third divided clock signals DIVCLK1 to DIVCLK3 is wider than the logic high level pulse width (dotted line) corresponding to the duty ratio of 50%. The reference clock signal REFCLK and the first to third divided clock signals DIVCLK1 to DIVCLK3 may sequentially have a phase difference of 90° therebetween. The phase difference may be different in another embodiment.

Figure 8B:
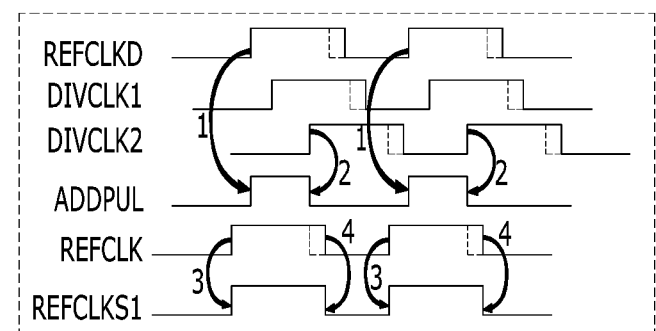

Referring to FIG. 8B, the DLY 17 may generate the delayed clock signal REFCLKD by delaying the reference clock signal REFCLK.

The clock combining circuit 31 may include the OR gate OR1 that performs an OR operation on the delayed clock signal REFCLKD and the first divided clock signal DIVCLK1. The clock combining circuit 31 may generate an output signal having a pulse activated to a logic high level during the period from the rising edge of the reference clock signal REFCLK and the falling edge of the first divided clock signal DIVCLK1.

The first correction pulse output circuit 32 may activate the first correction pulse ADDPUL to a logic high level on the basis of the rising edge of the clock signal output from the clock combining circuit 31. Furthermore, the first correction pulse output circuit 32 may output the first correction pulse ADDPUL activated to a logic high level when both the clock signal output from the clock combining circuit 31 and the inverted second divided clock signal DIVCLK2 are at logic high levels. The first correction pulse output circuit 32 may output the first correction pulse ADDPUL enabled to a logic high level during the period from the rising edge (1) of the delayed clock signal REFCLKD to the rising edge (2) of the second divided clock signal DIVCLK2.

The combining correction circuit 15 may generate the output clock signal REFCLKS1 by combining the logic high level period of the reference clock signal REFCLK with the logic high level period of the first correction pulse ADDPUL. Meanwhile, since the falling edge (4) of the first correction pulse ADDPUL corresponds to the rising edge of the second divided clock signal DIVCLK2 having a phase difference of 180° from the reference clock signal REFCLK, but the logic high level pulse width (solid line) of the reference clock signal REFCLK is wider than the logic high level pulse width (dotted line) corresponding to the duty ratio of 50%, the logic high level pulse width of the reference clock signal REFCLK may not be extended any longer. This may be the case even though the logic high level pulse of the reference clock signal REFCLK and the logic high level pulse of the first correction pulse ADDPUL are combined with each other.

Thus, in FIG. 8B, it can be understood that the logic high level pulse of the clock signal REFCLKS1 output from the combining correction circuit 15 may have substantially the same pulse width as the logic high level pulse of the reference clock signal REFCLK.

Figure 8C:
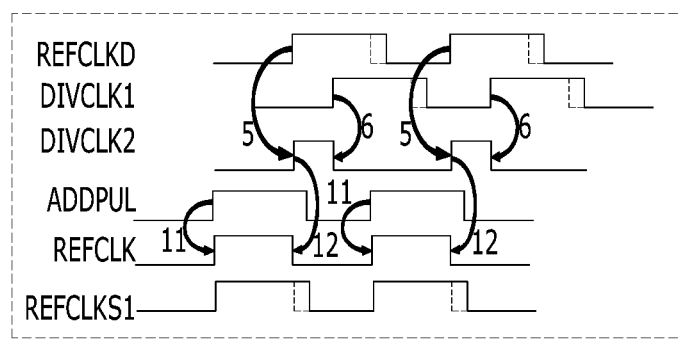

Referring to FIG. 8C, as described with reference to FIGS. 5C and 6C, the second correction pulse generation circuit 13 may output the second correction pulse CHOPPUL activated to a logic high level from the rising edge (5) of the second divided clock signal DIVCLK2 to the rising edge (6) of the third divided clock signal DIVCLK3. Furthermore, the logic high level pulse of the first correction pulse ADDPUL and the logic high level pulse of the second correction pulse CHOPPUL may not overlap each other.

However, in FIG. 8C, since the logic high level pulse width (solid line) of the reference clock signal REFCLK is wider than the logic high level pulse width (dotted line) corresponding to the duty ratio of 50% and the rising edge of the second correction pulse CHOPPUL corresponds to the rising edge of the second divided clock signal DIVCLK2 having a phase difference of 180° from the reference clock signal REFCLK, the logic high level pulse of the reference clock signal REFCLK and the logic high level pulse of the second correction pulse CHOPPUL may overlap each other. Thus, in FIG. 8C, the logic high level pulse of the second correction pulse CHOPPUL may be generated while the clock signal REFCLKS1 output from the combining correction circuit is at a logic high level. Accordingly, the deletion correction circuit 16 may generate the logic high level pulse of the clock signal REFCLKS2 by deleting the logic high level pulse of the second correction pulse CHOPPUL from the logic high level pulse of the clock signal REFCLKS1 output from the combining correction circuit 15.

The logic high level pulse of the clock signal REFCLKS2 output from the deletion correction circuit 16 may be substantially maintained from the rising edge (11) of the clock signal REFCLKS1 of the combining correction circuit 15 to the rising edge (12) of the second correction pulse CHOPPUL. At this time, it can be understood that the rising edge (12) of the second correction pulse CHOPPUL and the rising edge (5) of the second divided clock signal DIVCLK2 may be generated at substantially the same time point. Accordingly, it can be understood that the logic high level pulse of the clock signal REFCLKS1 of the combining correction circuit 15 is reduced by the logic high level pulse of the second correction pulse CHOPPUL and becomes substantially the same pulse as the logic high level pulse of the clock signal REFCLKS2 output from the deletion correction circuit 16.

As indicated in FIG. 9A, when the phase of the reference clock signal REFCLK is behind the phase of the first divided clock signal DIVCLK1, first correction pulse ADDPUL and second correction pulse CHOPPUL may be unnecessarily generated as indicated in FIGS. 6B and 6C.

Figure 9B:
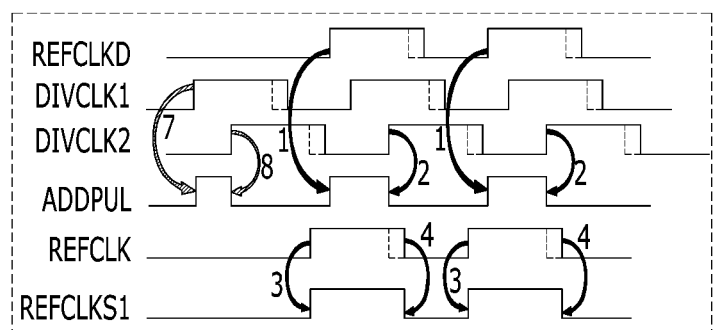

Referring to FIG. 9B, as described with reference to FIG. 6B, since the delayed clock signal REFCLKD is a clock signal obtained by delaying the reference clock signal REFCLK and each of the first divided clock signal DIVCLK1 and the second divided clock signal DIVCLK2 has a phase ahead of the reference clock signal REFCLK, the first correction pulse ADDPUL (which is activated to a logic high level from the rising edge (7) of the first divided clock signal DIVCLK1 to the rising edge (8) of the second divided clock signal DIVCLK2) may not be generated while the reference clock signal REFCLK is at a logic high level.

Accordingly, the combining correction circuit 15 may not activate the output clock signal REFCLKS1 to a logic high level with respect to the first logic high level pulse of the first correction pulse ADDPUL not generated while the reference clock signal REFCLK is at a logic high level.

Because there is a period in which the second and subsequent logic high level pulses of each of the first divided clock signal DIVCLK1 and the second divided clock signal DIVCLK2 overlap the first and subsequent logic high level pulses of the delayed clock signal REFCLKD, the first correction pulse ADDPUL may be generated while the reference clock signal REFCLK is at a logic high level, in substantially the same manner as described in FIGS. 5A-5C.

Accordingly, the combining correction circuit 15 may generate the output clock signal REFCLKS1, which is activated to a logic high level, with respect to the second and subsequent logic high level pulses of the first correction pulse ADDPUL generated while the reference clock signal REFCLK is at a logic high level.

Figure 9C:
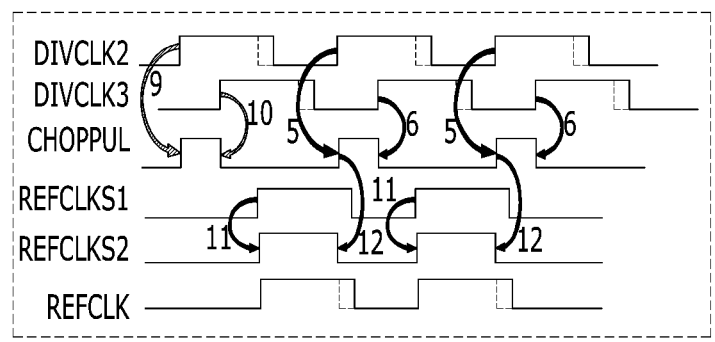

Referring to FIG. 9C, as described with reference to FIG. 5C and FIG. 6C, the second correction pulse generation circuit 13 may output the second correction pulse CHOPPUL activated to a logic high level during the period from the rising edge (5) of the second divided clock signal DIVCLK2 to the rising edge (6) of the third divided clock signal DIVCLK3. Furthermore, in FIG. 9C, since the phases of the second divided clock signal DIVCLK2 and the third divided clock signal DIVCLK3 are ahead of the phase of the reference clock signal REFCLK as indicated in FIG. 9B, the first logic high level pulse of the second correction pulse CHOPPUL may be generated before the first logic high level pulse of the clock signal REFCLKS1 output from the combining correction circuit 15 is started. Thus, like the first correction pulse ADDPUL described with reference to FIG. 9B, the first logic high level pulse of the second correction pulse CHOPPUL may be generated while the clock signal REFCLKS1 output from the combining correction circuit is at a logic low level. Accordingly, the deletion correction circuit 16 included in the duty correction circuit 14 may not activate the second correction pulse CHOPPUL to a logic high level with respect to the first logic high level pulse of the second correction pulse CHOPPUL.

Because there is a period in which the second and subsequent logic high level pulses of each of the second divided clock signal DIVCLK2 and the third divided clock signal DIVCLK3 overlap the first and subsequent logic high level pulses of the clock signal REFCLKS1 output from the combining correction circuit 15, the second correction pulse CHOPPUL may be generated while the clock signal REFCLKS1 output from the combining correction circuit 15 is at a logic high level, in substantially the same manner as described in FIG. 8C.

Accordingly, the deletion correction circuit 16 may generate the logic high level pulse of the output clock signal REFCLKS2. This deletion correction circuit 16 may perform this operation, for example, by deleting the logic high level pulse of the second correction pulse CHOPPUL from the logic high level pulse of the clock signal REFCLKS1 output from the combining correction circuit 15 with respect to the second and subsequent logic high level pulses of the second correction pulse CHOPPUL, generated while the clock signal REFCLKS1 output from the combining correction circuit 15 is at a logic high level.

For reference, FIGS. 9A and 9B have been described based on the assumption that, among the reference clock signal REFCLK and the first to third divided clock signals DIVCLK1 to DIVCLK3 included in the multi-phase clock signals, a clock signal having the most advanced phase is the first divided clock signal DIVCLK1. According to an embodiment, even when the clock signal having the most advanced phase is the second divided clock signal DIVCLK2 or the third divided clock signal DIVCLK3, first correction pulse ADDPUL and second correction pulse CHOPPUL may be unnecessarily generated as described above. In accordance with one embodiment, the duty correction circuit 14 may substantially prevent the first divided clock signal DIVCLK1 or the second divided clock signal DIVCLK2 from unnecessarily being generated according to the phase order of a clock signal from being reflected in a duty correction operation.

Figure 10:
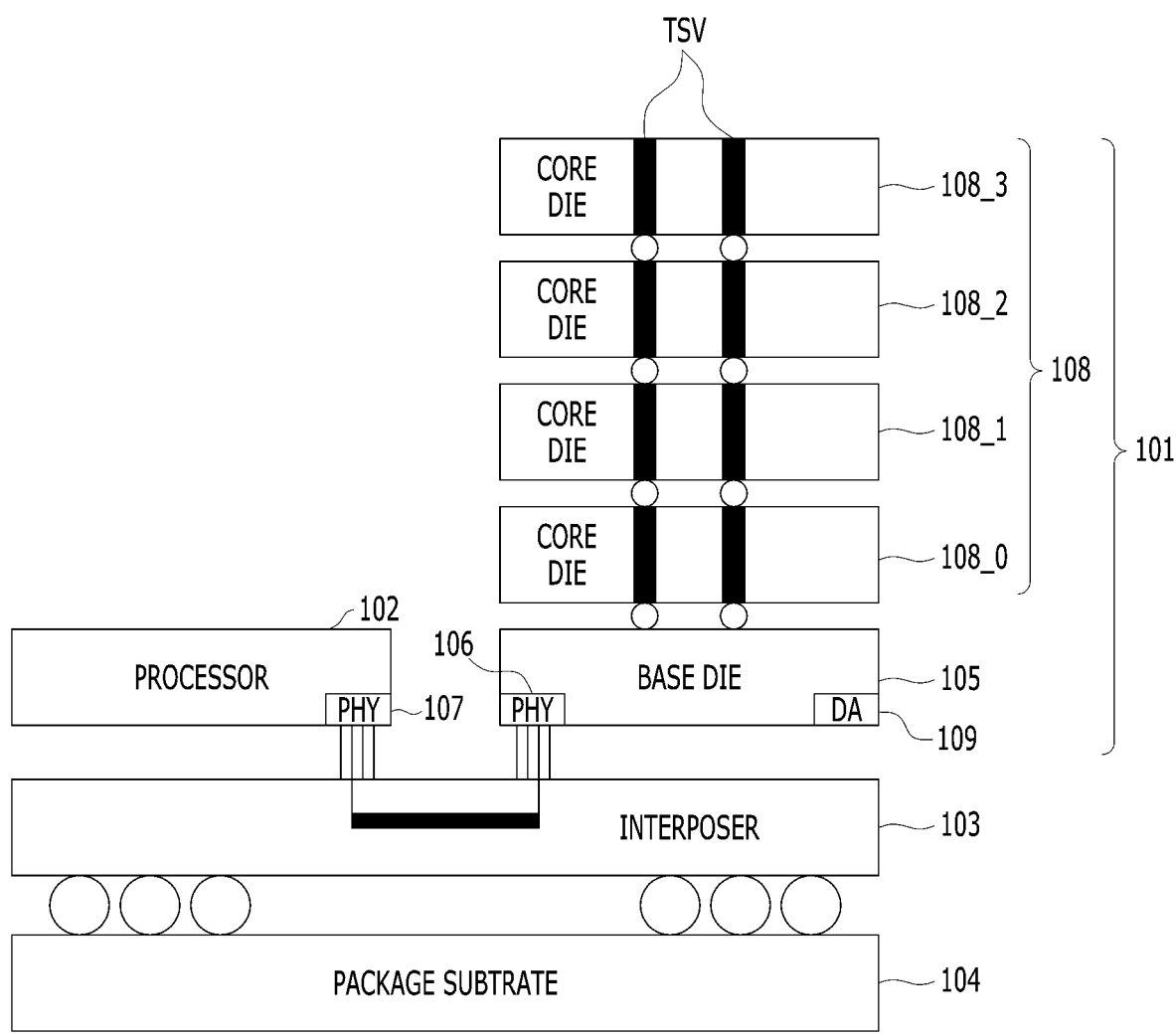
FIG. 10 illustrates an embodiment of a stacked semiconductor device.

FIG. 10 is a diagram illustrating an embodiment of a stacked semiconductor device included in a semiconductor system.

Referring to FIG. 10, a memory system 100 may include a stacked memory device 101, a memory controller (PROCESSOR) 102, an interposer (INTERPOSER) 103, and a package substrate (PACKAGE SUBSTRATE) 104.

The INTERPOSER 103 may be formed above the PACKAGE SUBSTRATE 104.

The stacked memory device 101 and the PROCESSOR 102 may be formed above the INTERPOSER 103.

The PROCESSOR 102 may include a central processing unit (CPU), a graphic processing unit (GPU), a digital signal processor (DSP), an application processor (AP), a controller chip, a memory controller chip, or another type of processing logic.

The memory device 101 may be a volatile memory device (e.g., a DRAM) and/or may be a nonvolatile memory device. Examples include a flash memory device, a phase change random access memory (PCRAM), a resistive random access memory (ReRAM), a ferroelectric random access memory (FeRAM), a magnetic random access memory (MRAM), and a spin transfer torque random access memory (SU-RAM). In one embodiment, the memory device 101 may include a combination of two or more of the volatile memory device and/or the nonvolatile memory device.

A physical area (PHY) 106 of the stacked memory device 101 may be connected to a physical area (PHY) 107 of the PROCESSOR 102. In each of the PHY 106 and the PHY 107, an interface circuit for communication between the stacked memory device 101 and the PROCESSOR 102 may be disposed.

The stacked memory device 101 may be configured, for example, in a high bandwidth memory (HBM) type in which bandwidth is increased by stacking a plurality of dies (e.g., semiconductor chips) in a vertical direction and electrically connecting the plurality of dies via through electrodes (through silicon vias (TSVs)).

The plurality of dies may include a base die (BASE DIE) 105 and a plurality of core dies (CORE DIEs) 108. The CORE DIEs 108 may be stacked on the BASE DIE and connected to one another via the TSVs.

Although FIG. 10 illustrates a case where four CORE DIES 108 (namely, first to fourth CORE DIEs 108_0 to 108_3) are stacked, a different number of dies and/or stacking configuration may be used in another embodiment.

In one embodiment, each of the CORE DIEs 108 may include a plurality of memory cells for storing data and a circuit for performing a core operation of the memory cell. A circuit (e.g., a circuit for an interface) disposed between the CORE DIE 108 and the PROCESSOR 102 may be mounted on the BASE DIE 105. This circuit may perform various functions in a semiconductor memory system. Examples include a memory management function such as power management and refresh of the memory cells or a timing adjustment function between the CORE DIE 108 and the PROCESSOR 102.

The BASE DIE 105 may also include the PHY 106 (an interface circuit for communication with the PROCESSOR 102) and an interface circuit for testing the stacked memory device 101.

Figure 11:
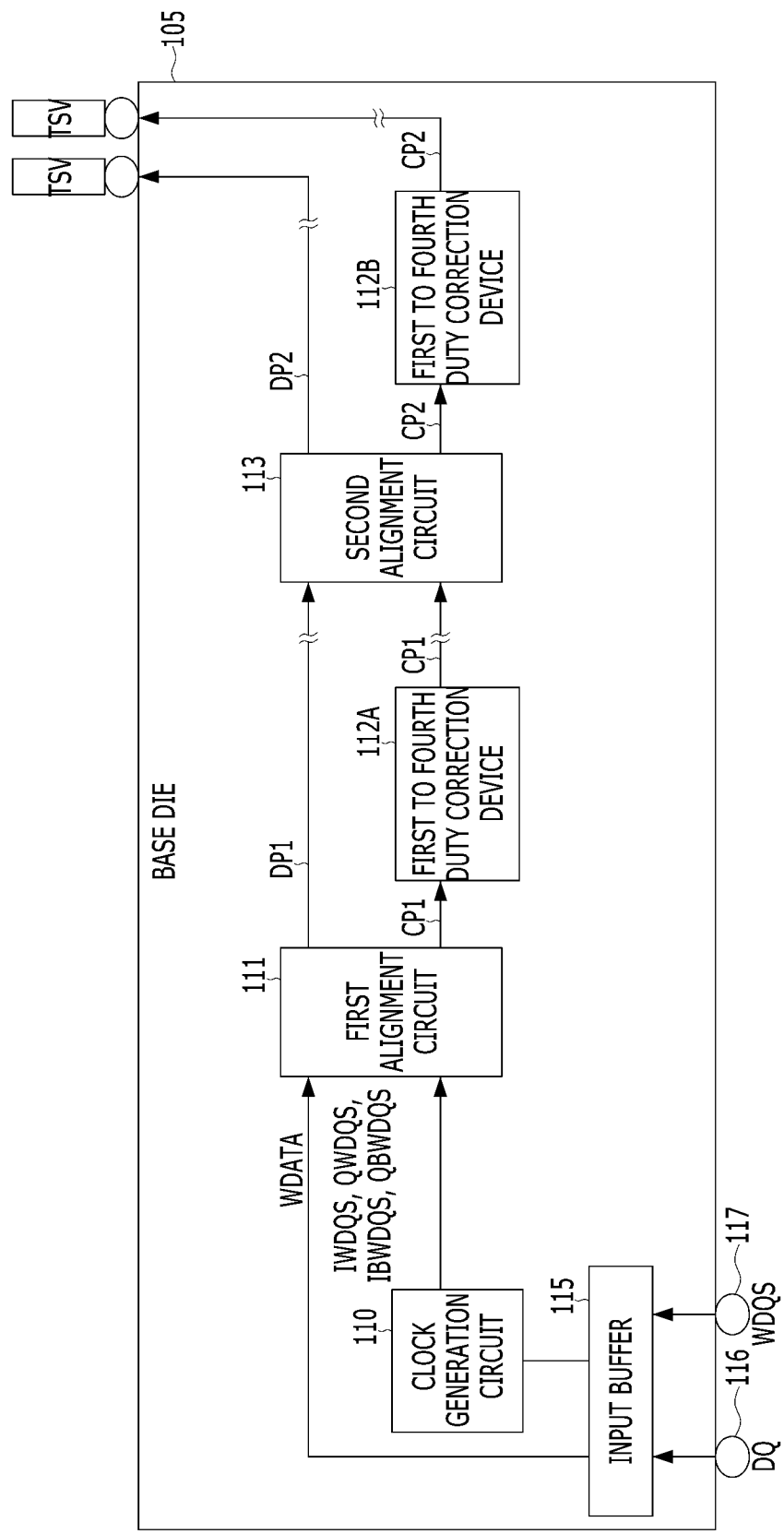
FIGS. 11 and 12 illustrate an embodiment of a base die including a duty correction device in a stacked semiconductor device.
Figure 12:
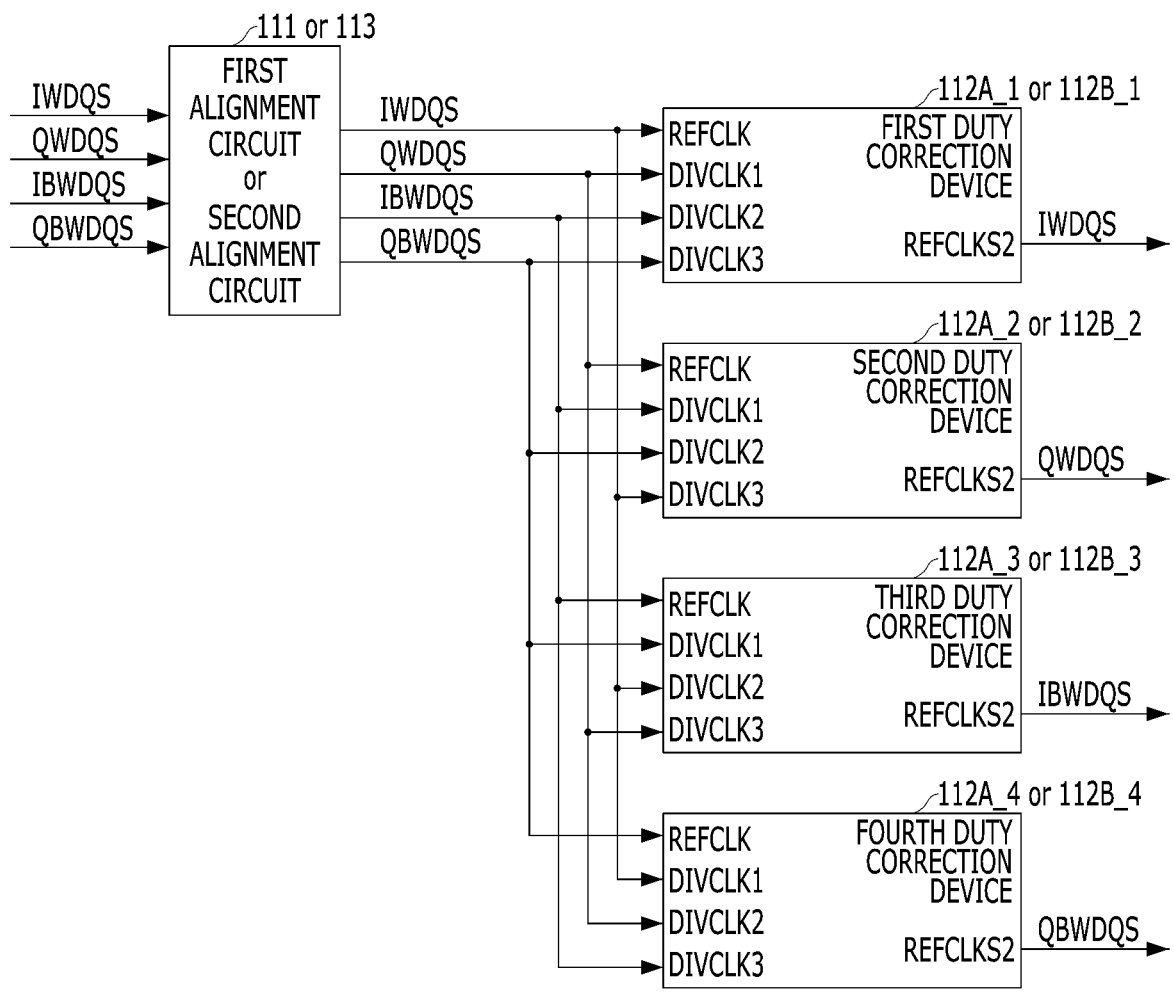

FIGS. 11 and 12 are diagrams illustrating embodiments of a base die including a duty correction device in a stacked semiconductor device as illustrated, for example, in FIG. 10.

Referring to FIG. 11, the BASE DIE 105 included in the stacked semiconductor device 100 of FIG. 10 may transmit write data WDATA and a write clock signal WDQS input through the PHY 106 to the TSV connected to the CORE DIE 108.

For example, the BASE DIE 105 may include a data pad 116, a data strobe pad 117, an input buffer 115, a clock generation circuit 110, a first alignment circuit 111, a second alignment circuit 113, and first to fourth duty correction devices 112A or 112B.

The data pad 116 may be included in the PHY 106 of the BASE DIE 105 and receive the write data WDATA.

The data strobe pad 117 may be included in the PHY 106 of the BASE DIE 105 and receive the write clock signal WDQS.

The input buffer 115 may buffer the write data WDATA input through the data pad 116 and the write clock signal WDQS input through the data strobe pad 117.

The clock generation circuit 110 may include a multi-phase clock generation circuit that may receive the write clock signal WDQS and generate a plurality of clock signals. The multi-phase clock generation circuit may generate the plurality of clock signals, for example, by dividing or not dividing a frequency of the write clock signal WDQS. The clock signals generated by the multi-phase clock generation circuit may have different phases, and in one embodiment may have phases synchronized with an edge of the write clock signal WDQS. For example, in accordance with one embodiment, the clock generation circuit 110 may generate first to fourth write clock signals IWDQS, QWDQS, IBWDQS, and QBWDQS by dividing the write clock signal WDQS (which is received through the data strobe pad 117) at a set ratio. The clock generation circuit 110 may divide the write clock signal WDQS, for example, at a ratio of ¼ to generate the first to fourth write clock signals IWDQS, QWDQS, IBWDQS, and QBWDQS which sequentially have a phase difference of 90° therebetween. For example, a rising edge of a first write clock signal IWDQS may have a phase ahead of a rising edge of the second write clock signal QWDQS by 90°, and the rising edge of the second write clock signal QWDQS may have a phase ahead of a rising edge of a third write clock signal IBWDQS by 90°. Furthermore, the rising edge of the third write clock signal IBWDQS may have a phase ahead of a fourth write clock signal QBWDQS by 90°, and the rising edge of the fourth write clock signal QBWDQS may have a phase ahead of the rising edge of the first write clock signal IWDQS by 90% The different phase difference may exist in another embodiment.

The first alignment circuit 111 may align the write data WDATA (input through the data pad 116) in response to the first to fourth write clock signals IWDQS, QWDQS, IBWDQS, and QBWDQS, transmit the first to fourth write clock signals IWDQS, QWDQS, IBWDQS, and QBWDQS through a first clock transmission path CP1, and transmit the write data WDATA through a first data transmission path DP1.

The first alignment circuit 111 may generate four write data by dividing the write data WDATA at a set ratio, align the generated four write data to each of the first to fourth write clock signals IWDQS, QWDQS, IBWDQS, and QBWDQS, and transmit the aligned data through the first data transmission path DP1.

The second alignment circuit 113 may align the write data WDATA (received through the first data transmission path DP1) in response to the first to fourth write clock signals IWDQS, QWDQS, IBWDQS, and QBWDQS received through the first clock transmission path CP1, transmit the first to fourth write clock signals IWDQS, QWDQS, IBWDQS, and QBWDQS through a second clock transmission path CP2, and transmit the write data WDATA through a second data transmission path DP2.

Each of the first clock transmission path CP1 and the second clock transmission path CP2 may be divided into a predetermined number (e.g., four) physical lines in order to transfer the first to fourth write clock signals IWDQS, QWDQS, IBWDQS, and QBWDQS. Similarly, each of the first data transmission path DP1 and the second data transmission path DP2 may be divided into four physical lines in order to respectively transfer the fourth write data.

The first to fourth duty correction devices 112A or 112B may perform a duty correction operation on each (or one or more) of the first to fourth write clock signals IWDQS, QWDQS, IBWDQS, and QBWDQS. Accordingly, the first to fourth duty correction devices 112A or 112B may be located in each path through which the first to fourth write clock signals IWDQS, QWDQS, IBWDQS, and QBWDQS are transmitted. As illustrated in the drawing, the first to fourth duty correction devices 112A or 112B may be respectively located in the first clock transmission path CP1 and the second clock transmission path CP2. In such a case, the first to fourth duty correction devices 112A located in the first clock transmission path CP1 and the first to fourth duty correction devices 112B located in the second clock transmission path CP2 may perform substantially the same operation.

In one embodiment, the first to fourth duty correction devices 112A located in the first clock transmission path CP1 may receive the first to fourth write clock signals IWDQS, QWDQS, IBWDQS, and QBWDQS transferred through the first clock transmission path CP1 respectively, and receive one of them as the reference clock signal REFCLK and the other of them as the first to third divided clock signals DIVCLK1 to DIVCLK3 alternatively according to the phases thereof. Additionally, the first to fourth duty correction devices 112A may detect a phase difference between the reference clock signal REFCLK and the first to third divided clock signals DIVCLK1 to DIVCLK3 and perform a duty correction operation on the reference clock signal REFCLK.

The first to fourth duty correction devices 112B located in the second clock transmission path CP2 may receive the first to fourth write clock signals IWDQS, QWDQS, IBWDQS, and QBWDQS transferred through the second clock transmission path CP2 respectively, and receive one of them as the reference clock signal REFCLK and the other of them as the first to third divided clock signals DIVCLK1 to DIVCLK3 alternatively according to the phases thereof. Additionally, the first to fourth duty correction devices 1126 may detect a phase difference between the reference clock signal REFCLK and the first to third divided clock signals DIVCLK1 to DIVCLK3 and perform the duty correction operation on the reference clock signal REFCLK.

In this way, it can be understood that the first to fourth duty correction devices 112A located in the first clock transmission path CP1 and the first to fourth duty correction devices 1126 located in the second clock transmission path CP2 are substantially the same as each other in that they perform the duty correction operation on each of the first to fourth write clock signals IWDQS, QWDQS, IBWDQS, and QBWDQS, except that they are located in different clock transmission paths, namely the first clock transmission path CP1 and the second clock transmission path CP2. Hereinafter, the first to fourth duty correction devices 112A located in the first clock transmission path CP1 and the first to fourth duty correction devices 1126 located in the second clock transmission path CP2 will be described by grouping them into one 'first to fourth duty correction devices 112A or 1126'.

Furthermore, each of the first to fourth duty correction devices 112A and 112B may perform substantially the same operation as the duty correction device 1 described above with reference to FIGS. 2 to 4B. For example, the other components, except for the clock generation circuit 11 among the components of the duty correction device 1 described above with reference to FIGS. 2 to 4B, that is, the first correction pulse generation circuit 12, the second correction pulse generation circuit 13, the duty correction circuit 14, and the DLY 17 may be included in each of the first to fourth duty correction devices 112A and 112B illustrated in FIG. 11 in substantially the same manner.

Accordingly, each of the first to fourth duty correction devices 112A and 112B may perform substantially the same operation as the duty correction device 1 described above with reference to FIGS. 2 to 4B. For example, each of the first to fourth duty correction devices 112A and 112B may detect a phase difference between the reference clock signal REFCLK and the write clock signals (the other three except for any one received as the reference clock signal REFCLK among IWDQS, QWDQS, IBWDQS, and QBWDQS) received as the first to third divided clock signals DIVCLK1 to DIVCLK3. Each of the first to fourth duty correction devices 112A and 112B may then perform the duty correction operation on the write clock signal (one of IWDQS, QWDQS, IBWDQS, and QBWDQS) received as the reference clock signal REFCLK (among the first to fourth write clock signals IWDQS, QWDQS, IBWDQS, and QBWDQS), except that each of the first to fourth duty correction devices 112A and 112B receive the first to fourth write clock signals IWDQS, QWDQS, IBWDQS, and QBWDQS, and receive one of them as the reference clock signal REFCLK and the other of them as the first to third divided clock signals DIVCLK1 to DIVCLK3 alternatively according to the phases thereof. Embodiments corresponding to the operation of each of the first to fourth duty correction devices 112A and 112B are explained relative to FIGS. 2 to 9C.

FIG. 11 illustrates that two alignment circuits 111 and 113 and two first to fourth duty correction devices 112A and 112B are included in the BASE DIE 105, but this is only one example. In another embodiment, a different (e.g., larger or smaller) number of alignment circuits and duty correction devices may be included according to a method in which the write data WDATA and the write clock signal WDQS are transmitted.

Referring to FIGS. 11 and 12 together, among the first to fourth duty correction devices 112A or 112B, a first duty correction device 112A_1 or 112B_1 may receive the first write clock signal IWDQS of the first to fourth write clock signals IWDQS, QWDQS, IBWDQS, and QBWDQS as the reference clock signal REFCLK, may receive the second write clock signal QWDQS as the first divided clock signal DIVCLK1, may receive the third write clock signal IBWDQS as the second divided clock signal DIVCLK2, and may receive the fourth write clock signal QBWDQS as the third divided clock signal DIVCLK3.

Among the first to fourth duty correction devices 112A or 112B, a second duty correction device 112A_2 or 112B_2 may receive the second write clock signal QWDQS of the first to fourth write clock signals IWDQS, QWDQS, IBWDQS, and QBWDQS as the reference clock signal REFCLK, may receive the third write clock signal IBWDQS as the first divided clock signal DIVCLK1, receive the fourth write clock signal QBWDQS as the second divided clock signal DIVCLK2, and may receive the first write clock signal IWDQS as the third divided clock signal DIVCLK3.

Among the first to fourth duty correction devices 112A or 112B, a third duty correction device 112A_3 or 112B_3 may receive the third write clock signal IBWDQS of the first to fourth write clock signals IWDQS, QWDQS, IBWDQS, and QBWDQS as the reference clock signal REFCLK, may receive the fourth write clock signal QBWDQS as the first divided clock signal DIVCLK1, may receive the first write clock signal IWDQS as the second divided clock signal DIVCLK2, and may receive the second write clock signal QWDQS as the third divided clock signal DIVCLK3.

Among the first to fourth duty correction devices 112A or 112B, a fourth duty correction device 112A_4 or 112B_4 may receive the fourth write clock signal QBWDQS of the first to fourth write clock signals IWDQS, QWDQS, IBWDQS, and QBWDQS as the reference clock signal REFCLK, may receive the first write clock signal IWDQS as the first divided clock signal DIVCLK1, may receive the second write clock signal QWDQS as the second divided clock signal DIVCLK2, and may receive the third write clock signal IBWDQS as the third divided clock signal DIVCLK3.

Referring to FIGS. 1 to 4B, 11, and 12 together, the first duty correction device 112A_1 or 112B_1 may include a 'clock delay circuit' for generating the delayed clock signal REFCLKD by delaying the first write clock signal IWDQS received as the reference clock signal REFCLK. Furthermore, the first duty correction device 112A_1 or 112B_1 may include a 'first correction pulse generation circuit' for detecting a phase difference between the delayed clock signal REFCLKD and the second write clock signal QWDQS received as the first divided clock signal DIVCLK1, and the third write clock signal IBWDQS received as the second divided clock signal DIVCLK2. The 'first correction pulse generation circuit' may then generate the first correction pulse ADDPUL for extending the logic high level pulse width of the reference clock signal REFCLK.

Furthermore, the first duty correction device 112A_1 or 112B_1 may include a 'second correction pulse generation circuit' for detecting a phase difference between the third write clock signal IBWDQS received as the second divided clock signal DIVCLK2 and the fourth write clock signal QBWDQS received as the third divided clock signal DIVCLK3. The 'second correction pulse generation circuit' may then generate the second correction pulse CHOPPUL for reducing the logic high level pulse width of the reference clock signal REFCLK.

Furthermore, the first duty correction device 112A_1 or 112B_1 may include a 'duty correction circuit' for checking the logic level of the reference clock signal REFCLK, the generation time point of the first correction pulse ADDPUL, and the generation time point of the second correction pulse CHOPPUL. The 'duty correction circuit' may then reflect at least one of the first correction pulse ADDPUL and the second correction pulse CHOPPUL in a duty correction operation for the reference clock signal REFCLK according to the check result.

Similarly to the aforementioned first duty correction device 112A_1 or 112B_1, the second duty correction device 112A_2 or 112B_2, the third duty correction device 112A_3 or 112B_3, and the fourth duty correction device 112A_4 or 112B_4 may also include the 'clock delay circuit', the 'first correction pulse generation circuit', the 'second correction pulse generation circuit', and the 'duty correction circuit', respectively.

Figure 13:
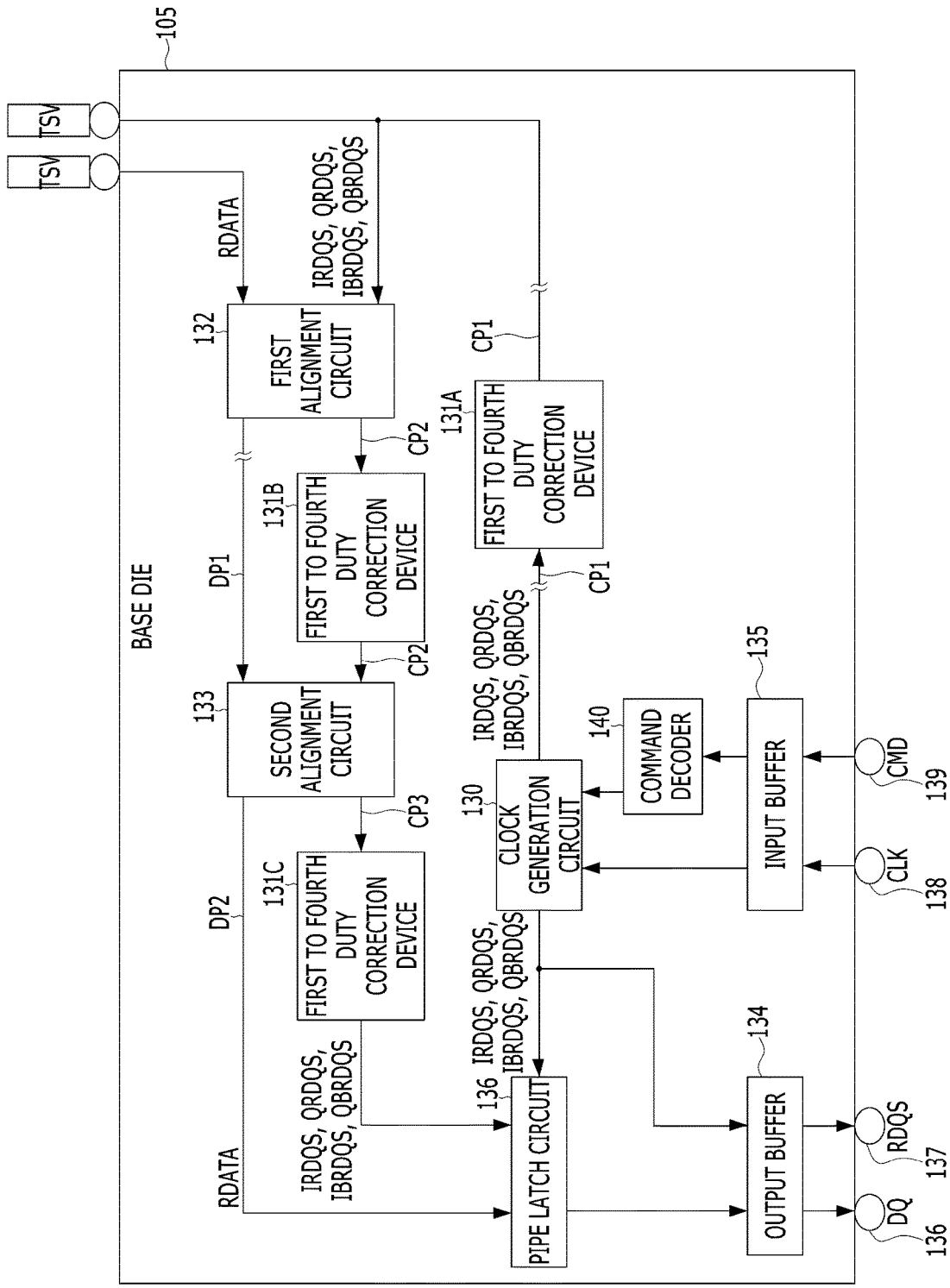
FIGS. 13 and 14 illustrate an embodiment of a base die including a duty correction device in a stacked semiconductor device.
Figure 14:
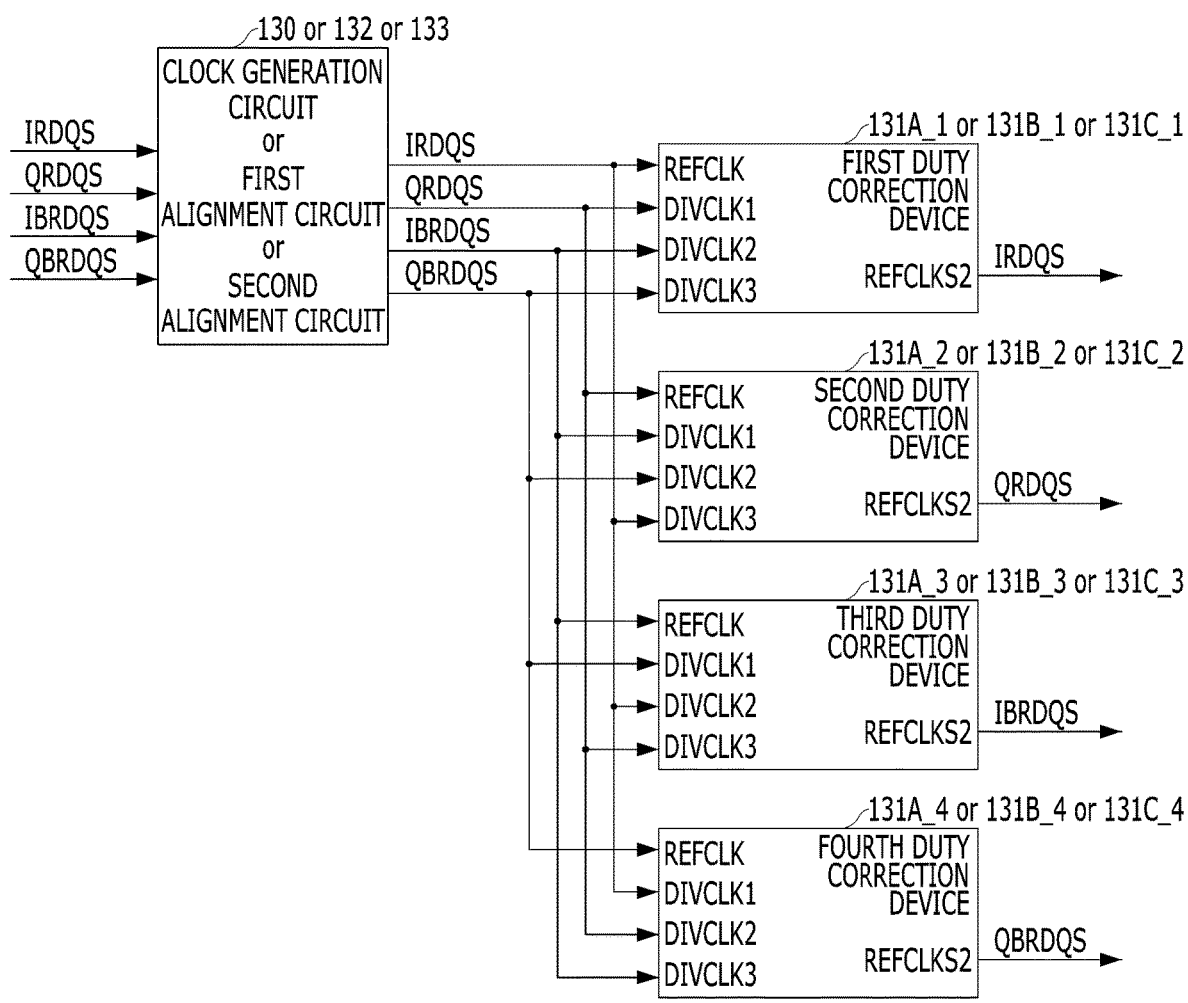

FIGS. 13 and 14 are diagrams illustrating an embodiment of a base die including a duty correction device in a stacked semiconductor device in accordance with FIG. 10.

Referring to FIG. 13, the BASE DIE 105 included in the stacked semiconductor device 100 may read read data DATA from the CORE DIE 108 by transmitting read clock signals IRDQS, QRDQS, IBRDQS, and QBRDQS (generated in response to a read command RDCMD and an external clock signal CLK received through the PHY 106) to the TSV connected to the CORE DIE 108, feed back the read data DATA read from the CORE DIE 108 and the read clock signals IRDQS, QRDQS, IBRDQS, and QBRDQS used for a read operation, and transmit the read data DATA and the read clock signals IRDQS, QRDQS, IBRDQS, and QBRDQS to the PHY 106.

In one embodiment, the BASE DIE 105 may include a command pad 139, a clock pad 138, a data strobe pad 137, a data pad 136, an input buffer 135, an output buffer 134, a command decoder 140, a clock generation circuit 130, a pipe latch circuit 136, a first alignment circuit 132, a second alignment circuit 133, and first to fourth duty correction devices 131A, 131B, or 131C.

The clock pad 138 may be included in the PHY 106 of the BASE DIE 105 and receive the external clock signal CLK.

The command pad 139 may be included in the PHY 106 of the BASE DIE 105 and receive a command signal CMD.

The data pad 136 may be included in the PHY 106 of the BASE DIE 105 and output the read data DATA.

The data strobe pad 137 may be included in the PHY 106 of the BASE DIE 105 and output a read clock signal RDQS.

The input buffer 135 may buffer the external clock signal CLK input through the clock pad 138 and the command signal CMD received through the command pad 139.

The output buffer 134 may buffer the read data DATA received from the pipe latch circuit 136 and the read clock signals IRDQS, QRDQS, IBRDQS, and QBRDQS received from the clock generation circuit 130.

The command decoder 140 may generate the read command RDCMD by decoding the command signal CMD received through the command pad 139.

The clock generation circuit 130 may include a multi-phase clock generation circuit which may receive the external clock signal CLK and generate a plurality of clock signals. The multi-phase clock generation circuit may generate the plurality of clock signals by dividing or not dividing a frequency of the external clock signal CLK. The clock signals generated by the multi-phase clock generation circuit may have different phases and may have phases synchronized with an edge of the external clock signal CLK. In accordance with one embodiment, the clock generation circuit 130 may generate the first to fourth read clock signals IRDQS, QRDQS, IBRDQS, and QBRDQS by dividing the external clock signal CLK, which is input through the clock pad 138, at a set ratio. This operation may be performed in response to the read command RDCMD generated by the command decoder 140, that decodes the command signal CMD received through the command pad 139.

Furthermore, the clock generation circuit 130 may transmit the first to fourth read clock signals IRDQS, QRDQS, IBRDQS, and QBRDQS generated therein to the first clock transmission path CP1, and may simultaneously transmit the first to fourth read clock signals IRDQS, QRDQS, IBRDQS, and QBRDQS to the data strobe pad 137. The clock generation circuit 130 may divide the external clock signal CLK at a predetermined ratio (e.g., ¼) to generate the first to fourth read clock signals IRDQS, QRDQS, IBRDQS, and QBRDQS sequentially having a predetermined phase difference (e.g., 90°) therebetween. For example, the rising edge of the first read clock signal IRDQS may have a phase ahead of the rising edge of a second read clock signal QRDQS by 90°, and the rising edge of the second read clock signal QRDQS may have a phase ahead of the rising edge of a third read clock signal IBRDQS by 90°. Furthermore, the rising edge of the third read clock signal IBRDQS may have a phase ahead of the rising edge of a fourth read clock signal QBWDQS by 90°, and the rising edge of the fourth write clock signal QBRDQS may have a phase ahead of the rising edge of the first read clock signal IRDQS by 90°.

The first alignment circuit 132 may align the read data DATA, which is output from a memory cell area included in the CORE DIE 108, in response to the first to fourth read clock signals IRDQS, QRDQS, IBRDQS, and QBRDQS received through the first clock transmission path CP1. The first alignment circuit 132 may then transmit the first to fourth read clock signals IRDQS, QRDQS, IBRDQS, and QBRDQS through the second clock transmission path CP2 and transmit the read data DATA through the first data transmission path DP1.

The second alignment circuit 133 may align the read data DATA, which is received through the first data transmission path DP1, in response to the first to fourth read clock signals IRDQS, QRDQS, IBRDQS, and QBRDQS received through the second clock transmission path CP2. The second alignment circuit 133 may then transmit the first to fourth read clock signals IRDQS, QRDQS, IBRDQS, and QBRDQS through a third clock transmission path CP3 and transmit the read data DATA through the second data transmission path DP2.

In one embodiment, each of the first clock transmission path CP1, the second clock transmission path CP2, and the third clock transmission path CP3 may be divided into four physical lines in order to transfer the first to fourth read clock signals IRDQS, QRDQS, IBRDQS, and QBRDQS.

The pipe latch circuit 136 may store the read data DATA, which is received through the second data transmission path DP2, in response to the first to fourth read clock signals IRDQS, QRDQS, IBRDQS, and QBRDQS received through the third clock transmission path CP3. The pipe latch circuit 136 may then output the read data DATA stored therein to the data pad 136 in response to the first to fourth read clock signals IRDQS, QRDQS, IBRDQS, and QBRDQS generated by the clock generation circuit 130.

The first to fourth duty correction devices 131A, 131B, or 131C may perform a duty correction operation on each of the first to fourth read clock signals IRDQS, QRDQS, IBRDQS, and QBRDQS. Accordingly, the first to fourth duty correction devices 131A, 131B, or 131C may be located in each path through which the first to fourth read clock signals IRDQS, QRDQS, IBRDQS, and QBRDQS are transmitted. For example, as illustrated, the first to fourth duty correction devices 131A, 131B, or 131C may be respectively located in the first clock transmission path CP1, the second clock transmission path CP2, and the third clock transmission path CP3. In such a case, the first to fourth duty correction devices 131A located in the first clock transmission path CP1, the first to fourth duty correction devices 131B located in the second clock transmission path CP2, and the first to fourth duty correction devices 131C located in the third clock transmission path CP3 may perform substantially the same operation.

In one embodiment, the first to fourth duty correction devices 131A located in the first clock transmission path CP1 may receive the first to fourth read clock signals IRDQS, QRDQS, IBRDQS, and QBRDQS transferred through the first clock transmission path CP1 respectively, may receive one of them as the reference clock signal REFCLK and the other of them as the first to third divided clock signals DIVCLK1 to DIVCLK3 alternatively according to the phases thereof, may detect a phase difference between the reference clock signal REFCLK and the first to third divided clock signals DIVCLK1 to DIVCLK3, and may perform a duty correction operation on the reference clock signal REFCLK.

The first to fourth duty correction devices 131B located in the second clock transmission path CP2 may receive the first to fourth read clock signals IRDQS, QRDQS, IBRDQS, and QBRDQS transferred through the second clock transmission path CP2 respectively, may receive one of them as the reference clock signal REFCLK and the other of them as the first to third divided clock signals DIVCLK1 to DIVCLK3 alternatively according to the phases thereof, may detect a phase difference between the reference clock signal REFCLK and the first to third divided clock signals DIVCLK1 to DIVCLK3, and may perform the duty correction operation on the reference clock signal REFCLK.

The first to fourth duty correction devices 131C located in the third clock transmission path CP3 may receive the first to fourth read clock signals IRDQS, QRDQS, IBRDQS, and QBRDQS transferred through the second clock transmission path CP2 respectively, may receive one of them as the reference clock signal REFCLK and the other of them as the first to third divided clock signals DIVCLK1 to DIVCLK3 alternatively according to the phases thereof, may detect a phase difference between the reference clock signal REFCLK and the first to third divided clock signals DIVCLK1 to DIVCLK3, and may perform the duty correction operation on the reference clock signal REFCLK.

In this way, it can be understood that in at least one embodiment, the first to fourth duty correction devices 131A located in the first clock transmission path CP1, the first to fourth duty correction devices 131B located in the second clock transmission path CP2, and the first to fourth duty correction devices 131C located in the third clock transmission path CP3 are substantially the same as one another in that they perform the duty correction operation on each of the first to fourth read clock signals IRDQS, QRDQS, IBRDQS, and QBRDQS, except that they are located in different clock transmission paths, that is, the first clock transmission path CP1, the second clock transmission path CP2, and the third clock transmission path CP3. Accordingly, hereinafter, the first to fourth duty correction devices 131A located in the first clock transmission path CP1, the first to fourth duty correction devices 131B located in the second clock transmission path CP2, and the first to fourth duty correction devices 131C located in the third clock transmission path CP3 will be described by grouping them into one 'first to fourth duty correction devices 131A, 131B, or 131C'.

In one embodiment, each of the first to fourth duty correction devices 131A, 131B, and 131C may perform substantially the same operation as the duty correction device 1 described above with reference to FIGS. 2 to 4B. For example, the other components, except for the clock generation circuit 11 among the components of the duty correction device 1 described above with reference to FIGS. 2 to 4B (that is, the first correction pulse generation circuit 12, the second correction pulse generation circuit 13, the duty correction circuit 14, and the DLY 17) may be included in each of the first to fourth duty correction devices 131A, 131B, and 131C illustrated in FIG. 13 in substantially the same manner.

Accordingly, each of the first to fourth duty correction devices 131A, 131B, and 131C may perform substantially the same operation as the duty correction device 1 described above with reference to FIGS. 2 to 4B. For example, each of the first to fourth duty correction devices 131A, 131B, and 131C may detect a phase difference between the reference clock signal REFCLK and the read clock signals (the other three except for any one received as the reference clock signal REFCLK among IRDQS, QRDQS, IBRDQS, and QBRDQS) received as the first to third divided clock signals DIVCLK1 to DIVCLK3. Each of the first to fourth duty correction devices 131A, 131B, and 131C may then perform the duty correction operation on the read clock signal (one of IRDQS, QRDQS, IBRDQS, and QBRDQS) received as the reference clock signal REFCLK among the first to fourth read clock signals IRDQS, QRDQS, IBRDQS, and QBRDQS, except that each of the first to fourth duty correction devices 131A, 131B, and 131C receive the first to fourth read clock signals IRDQS, QRDQS, IBRDQS, and QBRDQS and receive one of them as the reference clock signal REFCLK and the other of them as the first to third divided clock signals DIVCLK1 to DIVCLK3 alternatively according to the phases thereof. Embodiments corresponding to the operation of each of the first to fourth duty correction devices 131A, 131B, and 131C are discussed relative to FIGS. 2 to 9C.

For reference, FIG. 13 illustrates that two alignment circuits 132 and 133 and three first to fourth duty correction devices 131A, 131B, and 131C are included in the BASE DIE 105, but this is only one example. In other embodiments, a different (larger or smaller) number of alignment circuits and duty correction devices may be included according to a method in which the read data DATA and the read clock signal RDQS are transmitted.

Referring to FIGS. 13 and 14 together, among the first to fourth duty correction devices 131A, 131B, or 131C, a first duty correction device 131A_1, 131B_1, or 131C_1 may receive the first read clock signal IRDQS of the first to fourth read clock signals IRDQS, QRDQS, IBRDQS, and QBRDQS as the reference clock signal REFCLK, may receive the second read clock signal QRDQS as the first divided clock signal DIVCLK1, may receive the third read clock signal IBRDQS as the second divided clock signal DIVCLK2, and may receive the fourth read clock signal QBWDQS as the third divided clock signal DIVCLK3.

Among the first to fourth duty correction devices 131A, 131B, or 131C, a second duty correction device 131A_2, 131B_2, or 131C_2 may receive the second read clock signal QRDQS of the first to fourth read clock signals IRDQS, QRDQS, IBRDQS, and QBRDQS as the reference clock signal REFCLK, may receive the third read clock signal IBRDQS as the first divided clock signal DIVCLK1, may receive the fourth read clock signal QBWDQS as the second divided clock signal DIVCLK2, and may receive the first clock transmission path CP1 as the third divided clock signal DIVCLK3.

Among the first to fourth duty correction devices 131A, 131B, or 131C, a third duty correction device 131A_3, 131B_3, or 131C_3 may receive the third read clock signal IBRDQS of the first to fourth read clock signals IRDQS, QRDQS, IBRDQS, and QBRDQS as the reference clock signal REFCLK, may receive the fourth read clock signal QBWDQS as the first divided clock signal DIVCLK1, receive the first read clock signal IRDQS as the second divided clock signal DIVCLK2, and may receive the second read clock signal QRDQS as the third divided clock signal DIVCLK3.

Among the first to fourth duty correction devices 131A, 131B, or 131C, a fourth duty correction device 131A_4, 131B_4, or 131C_4 may receive the fourth read clock signal QBWDQS of the first to fourth read clock signals IRDQS, QRDQS, IBRDQS, and QBRDQS as the reference clock signal REFCLK, may receive the first read clock signal IRDQS as the first divided clock signal DIVCLK1, may receive the second read clock signal QRDQS as the second divided clock signal DIVCLK2, and may receive the third read clock signal IBRDQS as the third divided clock signal DIVCLK3.

Referring to FIGS. 1 to 4B, 13, and 14 together, the first duty correction device 131A_1, 131B_1, or 131C_1 may include a 'clock delay circuit' for generating the delayed clock signal REFCLKD by delaying the first read clock signal IRDQS received as the reference clock signal REFCLK. Furthermore, the first duty correction device 131A_1, 131B_1, or 131C_1 may include a 'first correction pulse generation circuit' for detecting a phase difference between the delayed clock signal REFCLKD and the second read clock signal QRDQS received as the first divided clock signal DIVCLK1/the third read clock signal IBRDQS received as the second divided clock signal DIVCLK2. The 'first correction pulse generation circuit' may then generate the first correction pulse ADDPUL for extending the logic high level pulse width of the reference clock signal REFCLK.

Furthermore, the first duty correction device 131A_1, 1316_1, or 131C_1 may include a 'second correction pulse generation circuit' for detecting a phase difference between the third read clock signal IBRDQS received as the second divided clock signal DIVCLK2 and the fourth read clock signal QBWDQS received as the third divided clock signal DIVCLK3. The 'second correction pulse generation circuit' may then generate the second correction pulse CHOPPUL for reducing the logic high level pulse width of the reference clock signal REFCLK.

Furthermore, the first duty correction device 131A_1, 1316_1, or 131C_1 may include a 'duty correction circuit' for checking the logic level of the reference clock signal REFCLK, the generation time point of the first correction pulse ADDPUL, and the generation time point of the second correction pulse CHOPPUL. The 'duty correction circuit" may then reflect at least one of the first correction pulse ADDPUL and the second correction pulse CHOPPUL in a duty correction operation for the reference clock signal REFCLK according to the check result.

Similarly to the aforementioned first duty correction device 131A_1, 1316_1, or 131C_1, the second duty correction device 131A_2, 1316_2, or 131C_2, the third duty correction device 131A_3, 1316_3, or 131C_3, and the fourth duty correction device 131A_4, 131B_4, or 131C_4 may also include the 'clock delay circuit', the 'first correction pulse generation circuit', the 'second correction pulse generation circuit', and the 'duty correction circuit', respectively.

The present disclosure described above is not limited to the aforementioned embodiment and the accompanying drawings, and it will be obvious to those skilled in the art to which the present disclosure pertains that various replacements, modifications, and changes can be made without departing from the technical scope of the present disclosure.

For example, the position and the type of a logic gate and a transistor exemplified in the aforementioned embodiment should be differentially realized according to the polarity of an input signal. The embodiments may be combined to form additional embodiments.

What is claimed is:

1. A duty correction device, comprising:
   a clock generation circuit configured to generate first to third divided clock signals, each having a phase offset from a reference clock signal;
   a first correction pulse generation circuit configured to generate a first correction pulse by detecting a phase difference between a delayed clock signal and the first and second divided clock signals, the delayed clock signal generated by delaying the reference clock signal;
   a second correction pulse generation circuit configured to generate a second correction pulse by detecting a phase difference between the second and third divided clock signals; and
   a duty correction circuit configured to check whether the first and second correction pulses are generated at a preset logic level of the reference clock signal, and to reflect at least one of the first or second correction pulses in a duty correction operation for the reference clock signal according to a result of the check.

2. The duty correction device of claim 1, wherein the duty correction circuit is configured to reflect one of the first or second correction pulse in the duty correction operation, the one of the first or second correction pulse generated at the preset logic level of the reference clock signal.

3. The duty correction device of claim 2, wherein the duty correction circuit comprises:
   a combining correction circuit configured to perform a first combining operation to combine the first correction pulse with the reference clock signal when the first correction pulse is generated at the preset logic level of the reference clock signal; and
   a deletion correction circuit configured to perform a first deletion operation to detect the second correction pulse from a first correction clock signal when the second correction pulse is generated at a preset logic low level of the first correction clock signal output from the combining correction circuit.

4. The duty correction device of claim 3, wherein the first correction pulse generation circuit comprises:
   a clock combining circuit configured to perform a second combining operation to combine the delayed clock signal with the first divided clock signal; and
   a first correction pulse output circuit configured to activate the first correction pulse at a rising edge of a second correction clock signal output from the clock combining circuit, and output the first correction pulse activated when both the second correction clock signal and an inverted second divided clock signal are at preset logic levels.

5. The duty correction device of claim 3, wherein the second correction pulse generation circuit is configured to activate the second correction pulse at a rising edge of the second divided clock signal, and output the second correction pulse activated when both the second divided clock signal and an inverted third divided clock signal are at logic high levels.

6. The duty correction device of claim 1, wherein the clock generation circuit is configured to generate the reference clock signal and the first to third divided clock signals with sequential 90° phase differences, the reference clock signal and the first to third divided clock signals generated by dividing an input clock signal at a ratio of ¼.

7. A semiconductor device, comprising:
a data pad and a data strobe pad;
a clock generation circuit configured to generate first to fourth write clock signals by dividing a write clock signal at a set ratio, the write clock signal received through the data strobe pad;
a first alignment circuit configured to align write data in response to the first to fourth write clock signals, the write data input through the data pad, and to transmit the first to fourth write clock signals and the write data through a first clock transmission path and a first data transmission path; and
first to fourth duty correction devices, each configured to receive the first to fourth write clock signals transferred through the first clock transmission path, to receive one of the first to fourth write clock signals as a reference clock signal and remaining ones of the first to fourth write clock signals as first to third divided clock signals alternatively according to phases of the first to fourth write clock signals, to detect a phase difference between the reference clock signal and the first to third divided clock signals, and to perform a duty correction operation on the reference clock signal.

8. The semiconductor device of claim 7, wherein each of the first to fourth duty correction devices comprises:
a first correction pulse generation circuit configured to generate a first correction pulse by detecting a phase difference between a delayed clock signal and the first and second divided clock signals, the delayed clock signal obtained by delaying the reference clock signal;
a second correction pulse generation circuit configured to generate a second correction pulse by detecting a phase difference between the second and third divided clock signals; and
a duty correction circuit configured to check whether the first and second correction pulses are generated at a preset logic level of the reference clock signal, and to reflect at least one of the first and second correction pulses in a duty correction operation for the reference clock signal according to a result of the check.

9. The semiconductor device of claim 8, wherein the duty correction circuit reflects one of the first or second correction pulse in the duty correction operation, the first or second correction pulse generated at the preset logic level of the reference clock signal.

10. The semiconductor device of claim 9, wherein the duty correction circuit comprises:
a combining correction circuit configured to perform a first combining operation to combine the first correction pulse with the reference clock signal when the first correction pulse is generated at the preset logic level of the reference clock signal; and
a deletion correction circuit configured to selectively perform a first deletion operation to delete the second correction pulse from a first correction clock signal when the second correction pulse is generated at a preset logic low level of the first correction clock signal output from the combining correction circuit.

11. The semiconductor device of claim 10, wherein the first correction pulse generation circuit comprises:
a clock combining circuit configured to perform a second combining operation to combine the delayed clock signal with the first divided clock signal; and
a first correction pulse output circuit configured to activate the first correction pulse at a rising edge of a second correction clock signal output from the clock combining circuit, and to output the first correction pulse activated when both the second correction clock signal and an inverted second divided clock signal are at preset logic levels.

12. The semiconductor device of claim 10, wherein the second correction pulse generation circuit is configured to activate the second correction pulse at a rising edge of the second divided clock signal, and to output the second correction pulse activated when both the second divided clock signal and an inverted third divided clock signal are at logic high levels.

13. The semiconductor device of claim 7, further comprising:
a second alignment circuit configured to align the write data in response to the first to fourth write clock signals received through the first clock transmission path, the write data received through the first data transmission path, and to transmit the first to fourth write clock signals and the write data through a second clock transmission path and a second data transmission path,
wherein each of first to fourth duty correction devices is configured to receive the first to fourth write clock signals transferred through the second clock transmission path respectively, receive one of the first to fourth write clock signals as the reference clock signal and remaining ones of the first to fourth write clock signals as the first to third divided clock signals alternatively according to the phases of the first to fourth write clock signals, detect the phase difference between the reference clock signal and the first to third divided clock signals, and perform the duty correction operation on the reference clock signal.

14. The semiconductor device of claim 7, wherein the clock generation circuit is configured to divide the write clock signal at a ratio of ¼ to generate the first to fourth write clock signals having sequential phase differences of 90° therebetween.

15. A semiconductor device, comprising:
a command pad, a clock pad, and a data strobe pad;
a clock generation circuit configured to generate first to fourth read clock signals by dividing an external clock signal at a set ratio in response to a read command received through the command pad, the external clock signal input through the clock pad, and to transmit the first to fourth read clock signals to a first clock transmission path and the data strobe pad;
a first alignment circuit configured to align read data in response to the first to fourth read clock signals received through the first clock transmission path, the read data output from a memory cell area, and to transmit the first to fourth read clock signals and the read data through a second clock transmission path and a first data transmission path; and
first to fourth duty correction devices, each configured to receive the first to fourth read clock signals transferred through the first and second clock transmission paths, to receive one of the first to fourth read clock signals as a reference clock signal and remaining ones of the first to fourth read clock signals as first to third divided clock signals alternatively according to phases of the first to fourth read clock signals, to detect a phase difference between the reference clock signal and the first to third divided clock signals, and to perform a duty correction operation on the reference clock signal.

16. The semiconductor device of claim 15, wherein each of the first to fourth duty correction devices comprises:
- a first correction pulse generation circuit configured to generate a first correction pulse by detecting a phase difference between a delayed clock signal and the first and second divided clock signals, the delayed clock signal obtained by delaying the reference clock signal;
- a second correction pulse generation circuit configured to generate a second correction pulse by detecting a phase difference between the second and third divided clock signals; and
- a duty correction circuit configured to check whether the first and second correction pulses are generated at a preset logic level of the reference clock signal, and to reflect at least one of the first or second correction pulses in a duty correction operation for the reference clock signal according to a result of the check.

17. The semiconductor device of claim 16, wherein the duty correction circuit is configured to reflect one of the first or second correction pulse in the duty correction operation, the first or second correction pulse generated at the preset logic level of the reference clock signal.

18. The semiconductor device of claim 17, wherein the duty correction circuit comprises:
- a combining correction circuit configured to perform a first combining operation to combine the first correction pulse with the reference clock signal when the first correction pulse is generated at the preset logic level of the reference clock signal; and
- a deletion correction circuit configured to perform a first deletion operation to delete the second correction pulse from a first correction clock signal when the second correction pulse is generated at a preset logic low level of the first correction clock signal output from the combining correction circuit.

19. The semiconductor device of claim 18, wherein the first correction pulse generation circuit comprises:
- a clock combining circuit configured to perform a second combining operation to combine the delayed clock signal with the first divided clock signal; and
- a first correction pulse output circuit configured to activate the first correction pulse at a rising edge of a second correction clock signal output from the clock combining circuit, and to output the first correction pulse activated when both the second correction clock signal and an inverted second divided clock signal are at preset logic levels.

20. The semiconductor device of claim 18, wherein the second correction pulse generation circuit is configured to activate the second correction pulse at a rising edge of the second divided clock signal, and to output the second correction pulse activated when both the second divided clock signal and an inverted third divided clock signal are at logic high levels.

21. The semiconductor device of claim 15, further comprising:
- a second alignment circuit configured to align the read data in response to the first to fourth read clock signals received through the second clock transmission path, the read data received through the first data transmission path, and to transmit the first to fourth read clock signals and the read data through a third clock transmission path and a second data transmission path,
- wherein each of first to fourth duty correction devices is configured to receive the first to fourth read clock signals transferred through the third clock transmission path, receive one of the first to fourth read clock signals as the reference clock signal and remaining ones of the first to fourth read clock signals as the first to third divided clock signals alternatively according to the phases of the first to fourth read clock signals, detect the phase difference between the reference clock signal and the first to third divided clock signals, and perform the duty correction operation on the reference clock signal.

22. The semiconductor device of claim 21, further comprising:
- a pipe latch circuit configured to store the read data in response to the first to fourth read clock signals received through the third clock transmission path, the read data received through the second data transmission path, and to output the read data stored therein to the data pad in response to the first to fourth read clock signals generated by the clock generation circuit.

23. The semiconductor device of claim 15, wherein the clock generation circuit is configured to generate the first to fourth read clock signals having sequential phase differences of 90° therebetween by dividing the external clock signal at a ratio of ¼.

* * * * *